US012772393B2

(12) United States Patent
Clear et al.

(10) Patent No.: US 12,772,393 B2
(45) Date of Patent: Oct. 20, 2026

(54) FLEXIBLE LIGHT-EMITTING DIODE BOARD WITH EDGE STRUCTURE FOR MAKING CONCAVE AND CONVEX CORNERS IN A MULTI-BOARD DISPLAY

(71) Applicant: EYE-FI HOLDINGS LLC, Las Vegas, NV (US)

(72) Inventors: Scott Allen Clear, Escondido, CA (US); Ronald Joe Crozier, Jr., Valdosta, GA (US); Ankit Kashmir Batra, San Diego, CA (US); Navjot Gurucharansingh Bomrah, San Diego, CA (US)

(73) Assignee: EYE-FI HOLDINGS LLC, Las Vegas, NV (US)

( * ) Notice: Subject to any disclaimer, the term of this patent is extended or adjusted under 35 U.S.C. 154(b) by 100 days.

(21) Appl. No.: 18/754,043

(22) Filed: Jun. 25, 2024

(65) Prior Publication Data

US 2025/0393143 A1 Dec. 25, 2025

(51) Int. Cl.

| | |
|---|---|
| ***H05K 5/02*** | (2006.01) |
| ***G09F 9/30*** | (2006.01) |
| ***G09F 9/33*** | (2006.01) |

(52) U.S. Cl.

CPC ........... *H05K 5/0217* (2013.01); *G09F 9/301* (2013.01); *G09F 9/33* (2013.01)

(58) Field of Classification Search

CPC ......... H05K 5/0217; G09F 9/301; G09F 9/33; G09F 9/3026

See application file for complete search history.

(56) References Cited

U.S. PATENT DOCUMENTS

| | | | |
|---|---|---|---|
| 5,963,432 | A | 10/1999 | Crowley |
| 2002/0122134 | A1 | 9/2002 | Kalua |

(Continued)

FOREIGN PATENT DOCUMENTS

| | | | |
|---|---|---|---|
| CN | 211376072 | U | 8/2020 |
| CN | 212161180 | U | 12/2020 |

(Continued)

OTHER PUBLICATIONS

US Patent and Trademark Office, International Search Report and Written Opinion issued by the US International Search Authority in PCT/US2025/034391, mailed Aug. 20, 2025, 10 pages.

*Primary Examiner* — Bao Q Truong

(74) *Attorney, Agent, or Firm* — Schwabe, Williamson & Wyatt, P.C.

(57) ABSTRACT

A light-emitting diode (LED) display apparatus includes a flexible LED panel and a frame. The frame extends around a periphery of the LED panel and can comprise a flexible material with embedded magnets to attach to a metal mounting structure. In an example implementation, the frame includes beveled edges to allow adjacent LED panels in a multi-panel display to be positioned close together without a gap. In another example implementation, the frame includes protrusions at staggered locations along the edge. The protrusions of one frame are configured to interdigitate with the protrusions of an adjacent frame to allow the adjacent LED panels to be positioned close together. The mounting structure can have a corresponding shape with protrusions at staggered locations. In another example implementation, a frameless LED panel is used with standoff fasteners. Magnets can also be surface-mounted to the LED panel without fasteners.

10 Claims, 20 Drawing Sheets

(56) References Cited

U.S. PATENT DOCUMENTS

| | | | | |
|---|---|---|---|---|
| 2017/0146851 | A1* | 5/2017 | Shi | G02F 1/133526 |
| 2020/0194539 | A1* | 6/2020 | Kim | G06F 3/1446 |
| 2023/0297137 | A1* | 9/2023 | Kim | H10K 59/87<br>361/679.01 |
| 2024/0013684 | A1 | 1/2024 | Snedeker et al. | |

FOREIGN PATENT DOCUMENTS

| | | | |
|---|---|---|---|
| CN | 112365800 | A | 2/2021 |
| CN | 213659874 | U | 7/2021 |
| CN | 217506827 | U | 9/2022 |

* cited by examiner

FLEXIBLE LIGHT-EMITTING DIODE BOARD WITH EDGE STRUCTURE FOR MAKING CONCAVE AND CONVEX CORNERS IN A MULTI-BOARD DISPLAY

TECHNICAL FIELD

Embodiments herein relate to a display apparatus such as a multi-panel light-emitting diode (LED) display.

BACKGROUND

LED panels can be used in many applications, including but not limited to indoor applications such as bank counters, supermarket promotion display boards, and casino display boards, and outdoor applications such as brand display boards and advertisement signs. Multiple LED panels can be attached to an underlying mounting structure to create a larger display. Moreover, with the use of flexible panels, curved surface shapes can be achieved. However, various challenges are presented in minimizing gaps between adjacent panels in a multi-panel display.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

DETAILED DESCRIPTION OF DISCLOSED EMBODIMENTS

Figure 1:
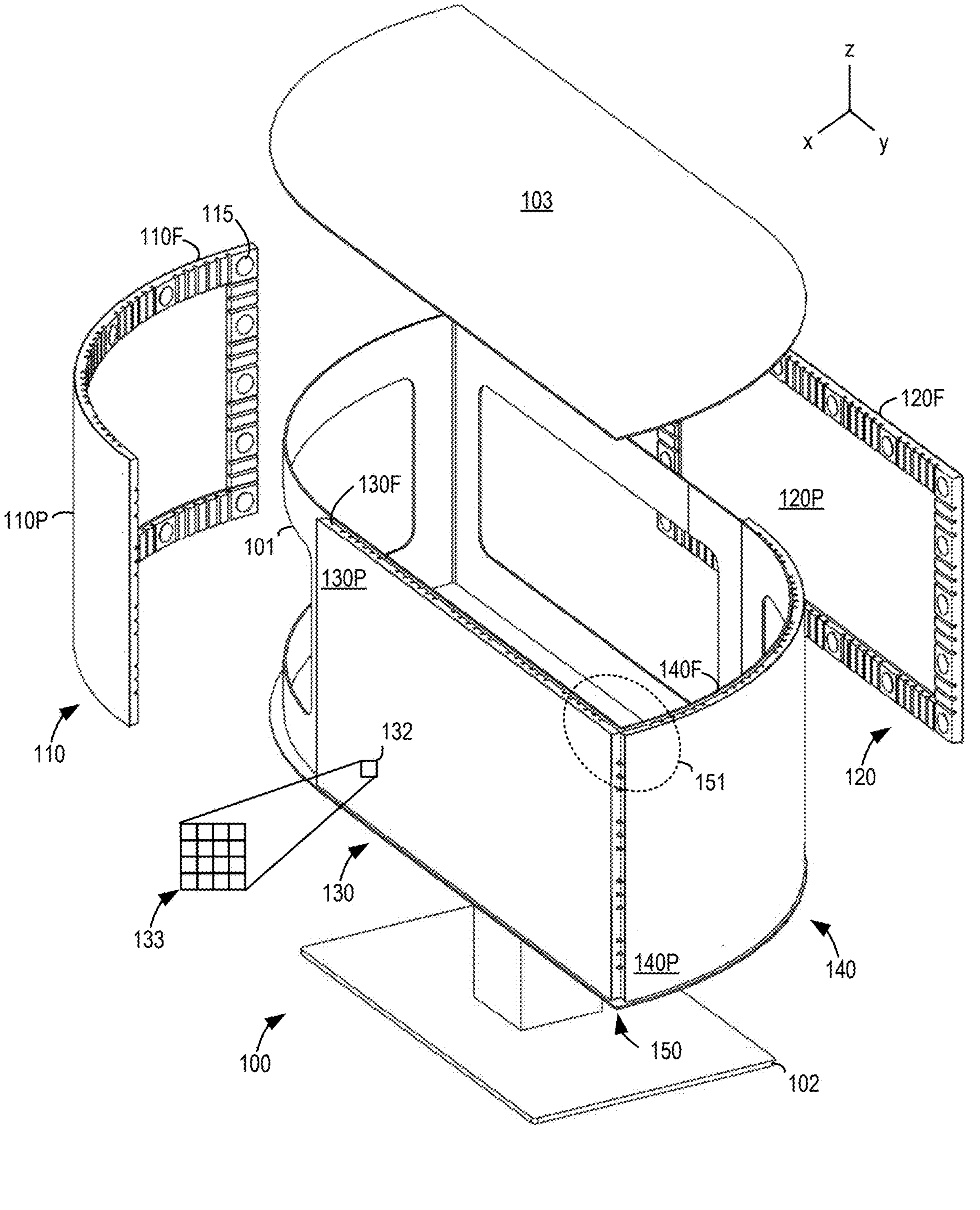
FIG. 1 depicts an LED display apparatus 100, where a gap 150 results when LED panel assemblies 130 and 140 are attached to a mounting structure 101, in accordance with various embodiments.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical contact with each other. "Coupled" may mean that two or more elements are in direct physical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A) B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

As mentioned at the outset, various challenges are presented in minimizing gaps between adjacent panels in a multi-panel display. Various types of LED panels can be used in a multi-panel display. For example, a rigid LED display panel can have a rigid frame made, e.g., of plastic, attached at the back of the panel. The rigid LED panel can be made of a rigid printed circuit board (PCB) material such as fiberglass. A flexible LED panel can be attached to a frame made, e.g., of rubber or silicone. The flexible LED panel can be made of a soft/flexible printed circuit board (PCB) material and rubber, for instance. Soft PCBs may be made of flexible substrate materials such as polyimide, polyester, or transparent conductive polyester film. Another option is a bare LED panel that is frameless.

The frame can be attached to a mounting structure in various ways. For example, the frame can include magnets that can be attached to a ferromagnetic metal of a mounting structure, or standoff fasteners that are bolted or snapped into place via holes in the mounting structure. A bare or frameless LED panel can also be used, where the panel includes magnets or standoff fasteners, for example. In some cases, magnets with different heights can be used to fine-tune the position of a panel. However, gaps or seams can still occur between adjacent panels, particularly where the panels meet at an angle. This results in an unattractive discontinuity in the multi-panel display.

The solutions provided herein address the above and other issues.

In an example implementation, a frame for an LED panel includes beveled edges to minimize the gap between adjacent panels. The frame can extend around the edges of the LED panel such as in a rectangular shape. The frame can be attached to the back of the LED panel with adhesive and/or fasteners. The edges of the panel can extend beyond the beveled edges to allow the adjacent panels to be positioned in different ways. In different installations, the inside edges or outer edges of the adjacent panels can be aligned, or the outside edges of the panels can be offset from one another. The beveled edges can be provided on left and right sides and/or top and bottom of the frame.

In another example implementation, the frame includes lateral protrusions at staggered locations along its edges. During installation of adjacent panels, the protrusions of one frame can be interdigitated, or overlapped, with the protrusions of the adjacent frame. That is, the protrusions of one frame extend between the protrusions of the adjacent frame. The lateral protrusions can be rounded and/or rectangular.

In another example implementation, the panel is a bare panel with standoff fasteners that snap-fit into holes of the mounting structure.

In another example implementation, the panel is a bare panel with magnets attached to standoff fasteners to allow for a magnetic attachment to the mounting structure.

Combinations of snap-fit and magnetic fasteners can be used as well.

The above and other features can be understood further in view of the following discussion.

FIG. 1 depicts an LED display apparatus 100, where a gap 150 results when LED panel assemblies 130 and 140 are attached to a mounting structure 101, in accordance with various embodiments. This is an example of a freestanding apparatus having two parallel sides and two curved sides. The apparatus includes a base 102 and a mounting structure 101 attached to the base. Four LED panel assemblies, also referred to a LED boards, are provided in this example. The LED panel assemblies 120 and 130 are attached to opposing planar sides of the mounting structure, and can have a rigid or flexible frame. The LED panel assemblies 110 and 140 are attached to opposing curved sides of the mounting structure. Each LED panel assembly has opposing sides adjacent to another LED panel assembly. A cap 103 can also be placed over the mounting structure.

The LED panel assembly 110 includes a frame 110F and an LED panel 110P. The LED panel assembly 120 includes a frame 120F and an LED panel 120P. The LED panel assembly 130 includes a frame 130F and an LED panel 130P. The LED panel assembly 140 includes a frame 140F and an LED panel 140P.

Each LED panel has LEDs on a front surface. For example, the LED panel 130P includes an example area 132 with pixels 133. Pixels can be characterized by their pitch, size and resolution. Circuitry for operating the LEDs can be provided on the back of the panel. A frame can be attached to the back of each panel to allow the panel to be attached to the mounting structure. In this example, each frame extends around the periphery of the panel and is attached to the back of the panel such as with adhesive or fasteners. The frames in this example are flexible and include notches that improve their ability to bend. Example flexible materials include rubber and silicone.

Desirable characteristics of a flexible LED display panel include, but are not limited to, the ability to: be used as a flat/planar panel, bend in a curve, e.g., with a minimum radius of three inches, make a 80° to 180° corner with an adjacent panel with a small separation, make a 90° corner on all faces of a cube with a small separation, and be compliant with GOB and SMD variants.

Each frame also includes magnets spaced periodically along the lengths of the frames. See the example magnet 115 in the frame 110F. The magnets are circular in this example and are held in recesses in the frame.

The mounting structure can include horizontal and vertical rails that are positioned to correspond to the locations of the magnets on the frames when the assemblies are properly installed on the mounting structure.

A gap 150 is present between the edges of the LED panel assemblies 130 and 140. Such a gap results in a discontinuity in the multi-panel display that affects its appearance. The gap is caused by the rectangular cross-section of the frames, as shown in further detail in FIG. 2. The panels 130P and 140P meet at a right angle in this example but other options are possible, e.g., from 80-180 degrees.

Note that while an LED panel is referred to, other types of light-emitting panels could be used as well.

In one option, an LED panel with exposed LEDs is mounted to a surface, in surface-mounted device (SMD). In one option, a flexible protective layer is applied to the LED surface of a glue-on-board (GOB).

A Cartesian coordinate system with x, y, and z axes is depicted for reference. The panels 120P and 130P extend in the y-z plane.

The LED display apparatus can include circuits such as a power supply, sending and receiving units, distribution board, junction box and power switch. A sending unit is responsible for converting an input video signal (e.g., HDMI/DVI/USB-C) to a format that the screen can interpret. It can include, e.g., a High-Definition Multimedia Interface (HDMI), Digital Visual Interface (DVI) or Universal Serial Bus (USB) Type-C interface. The receiving card receives video data and assigns it to each LED chip that makes up the screen, forming the image into a complete and neat corresponding size. The power supply is a device used to regulate the power needed to operate the LED apparatus. It converts alternating current (AC) to a direct current (DC) and has a range of functions that allow the user to control the LEDs. The junction box is a metal or plastic enclosure for wiring connections. The distribution board is part of an electrical system that takes electricity from a main source and feeds it through one or more circuits to distribute the electricity throughout the LED apparatus. The circuits may be compliant with the Underwriters Laboratories Inc. (UL) 48 Standard for Electric Signs.

Figure 2:
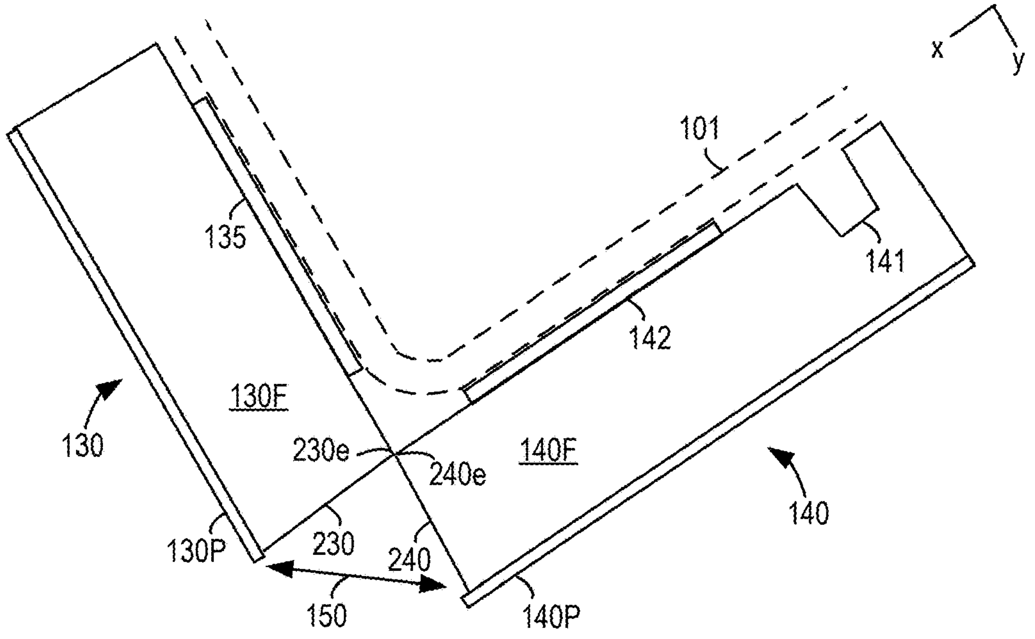
FIG. 2 depicts a top-down view of the region 151 in FIG. 1, showing the gap 150 between the adjacent LED panel assemblies 130 and 140 in an edge-to-edge configuration, in accordance with various embodiments.

FIG. 2 depicts a top-down view of the region 151 in FIG. 1, showing the gap 150 between the adjacent LED panel assemblies 130 and 140 in an edge-to-edge configuration, in accordance with various embodiments. The LED panel assembly 130 includes the panel 130P, frame 130F and magnet 135 attached to the mounting structure 101. LED panel assembly 140 includes the panel 140P, frame 140F and magnet 142 attached to the mounting structure 101. The frame is depicted as being thicker than the LED panel in this example. The frames 130F and 140F include end surfaces or faces 230 and 240, respectively, with edges 230*e* and 240*e*, respectively, that are aligned and touch one another. The edge faces are at right angles to the planes of the LED panels 130P and 140P, respectively, in this example. This configuration results in the relatively large gap 150 when the end surfaces are end to end at the edges or corners 230*e* and 240*e* as shown. The frames 130F and 140F also include an example notch 134 and 141, respectively, which increases flexibility. The panels 130P and 140P are at a right angle to one another in this example. Another option for positioning the LED panels is depicted in FIG. 3.

Figure 3:
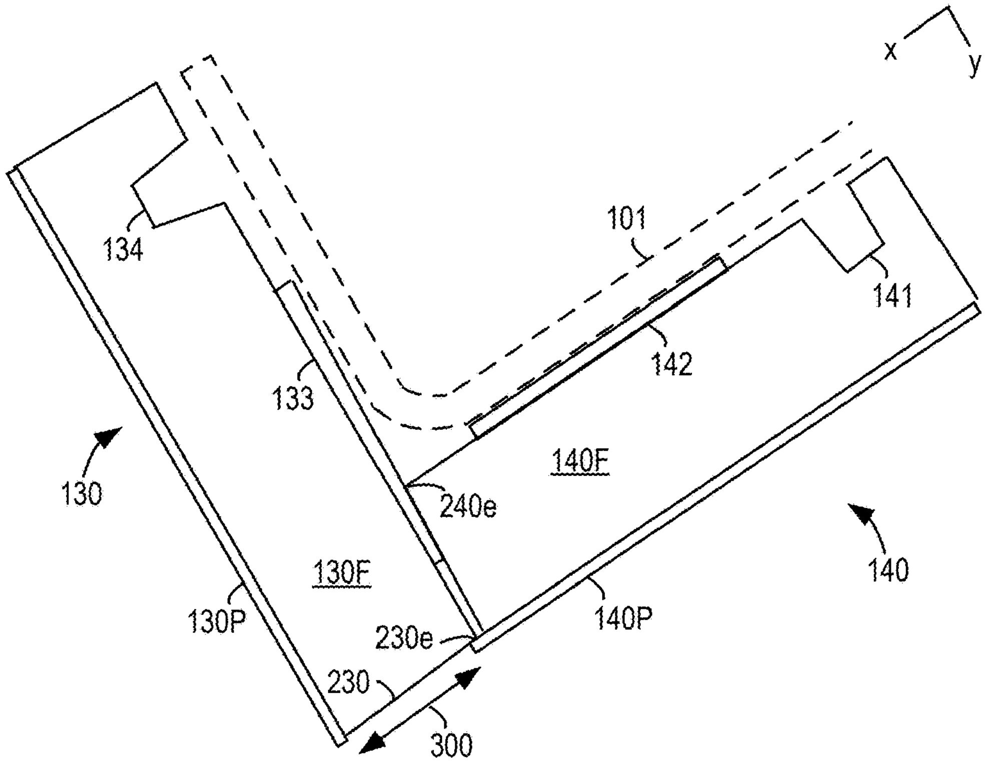
FIG. 3 depicts a top-down view of the region 151 in FIG. 1, showing a gap (represented by an arrow 300) between the adjacent LED panel assemblies 130 and 140 in an overlap configuration, in accordance with various embodiments.

FIG. 3 depicts a top-down view of the region 151 in FIG. 1, showing a gap (represented by an arrow 300) between the adjacent LED panel assemblies 130 and 140 in an overlap configuration, in accordance with various embodiments. In this example, the LED panel assemblies are positioned on the mounting structure so that the end face 240 of the frame 140F is adjacent to the frame 130F and the magnet 135. This approach avoids the gap 150 but instead results in the end face 230 of the frame 130F being exposed over a distance represented by the arrow 300. The edge 240*e* is also offset from the edge 230*e* by a similar distance. This configuration results in a discontinuity in the multi-panel display since the end face 230 does not have LEDs.

Figure 4A:
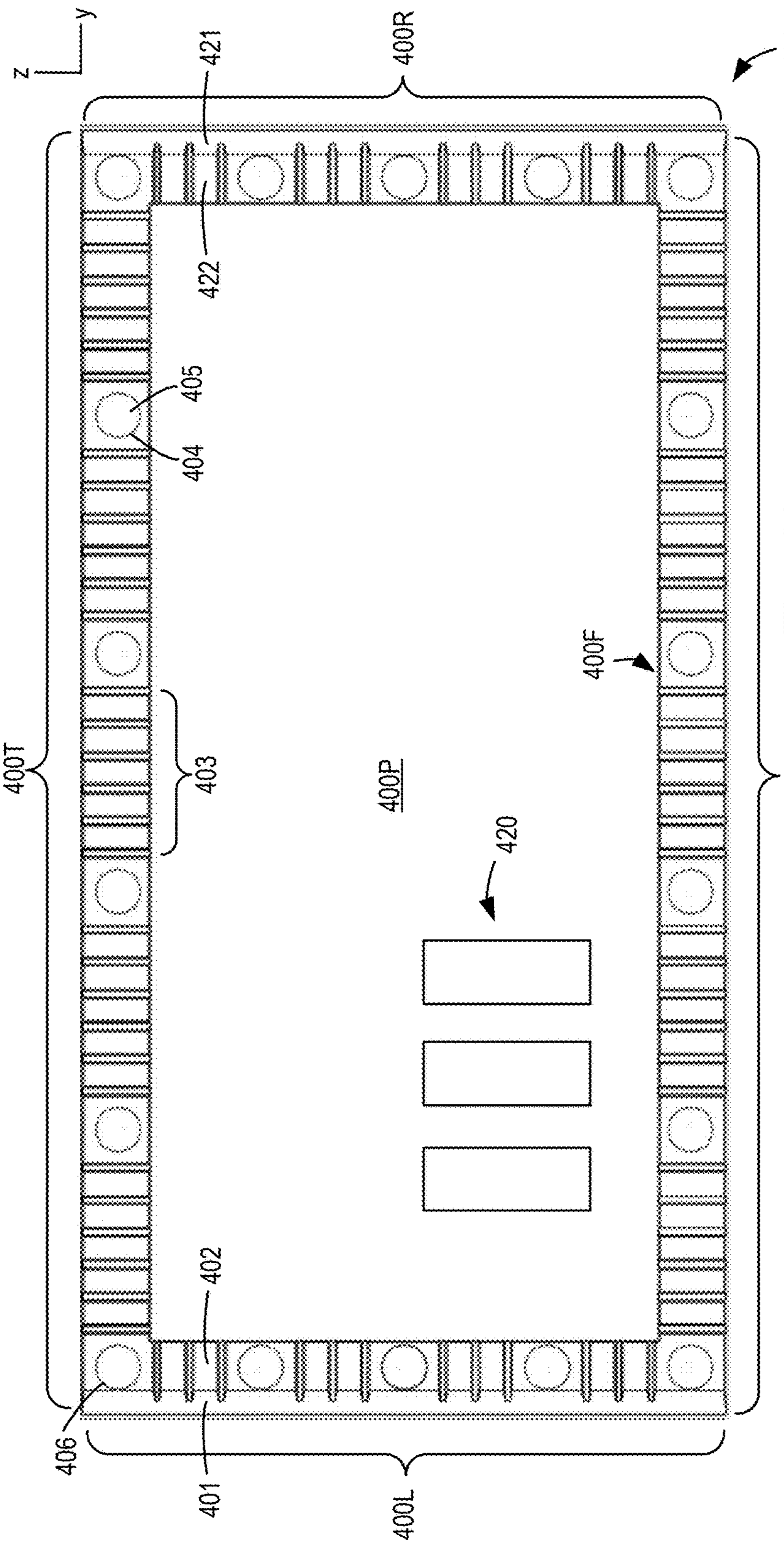
FIG. 4A depicts a view in a y-z plane of an example LED panel assembly 400 where opposing sides 400L and 400R of a frame 400F have beveled edges 401 and 421, respectively, in accordance with various embodiments.

FIG. 4A depicts a view in a y-z plane of an example LED panel assembly 400 having opposing sides 400L and 400R of a frame 400F have beveled edges 401 and 421, respectively, in accordance with various embodiments. The assembly includes a frame 400F attached to an LED panel 400P that extends in a y-z plane. The frame includes first and second opposing sides 400L and 400R, respectively, e.g., left and right sides, respectively, and third and fourth opposing sides 400T and 400B, respectively, e.g., top and bottom, respectively. The top and/or bottom are longer than the left and right sides in this example. The first and second sides 400L and 400R of the frame have beveled edges 401 and 421, respectively, and portions 402 and 422, respectively, which may be non-beveled and have a rectangular cross-section in the x-y plane, for example. The third and fourth opposing sides 400T and 400B do not have beveled edges in this example and have a rectangular cross-section. The frame sides also have notches to facilitate bending. Magnets such as example magnets 405 and 406 are embedded in the frame at periodic locations. For example, the magnet 405 may be embedded in a recess 404 of the frame side 400T. There are one or more magnets adjacent to the beveled edges. Circuits 420 for controlling the LED display can be attached to the back of the LED panel 400P.

Notches 403 can be formed in the frame at periodic locations along the lengths of the first and second frame side 500 Land 500R, respectively, to increase the bending ability of the frame.

The frame sides are joined to form a continuous frame around the periphery of the LED panel in this example but in another option the frame is made up of discontinuous portions around the periphery of the LED panel.

An option to a beveled edge is a chamfered edge.

The panel can be of any size with any pixel density. The LED panel 400P may extend laterally beyond the beveled edges of the first and second sides.

In one approach, an existing LED panel assembly can be modified/retrofitted to add the frame sides with the beveled edges. For example, the frame sides 400L and 400R can be cut and removed, then replaced by new frame sides with beveled edges that are glued down to the back of the LED panel 400P.

Figure 4B:
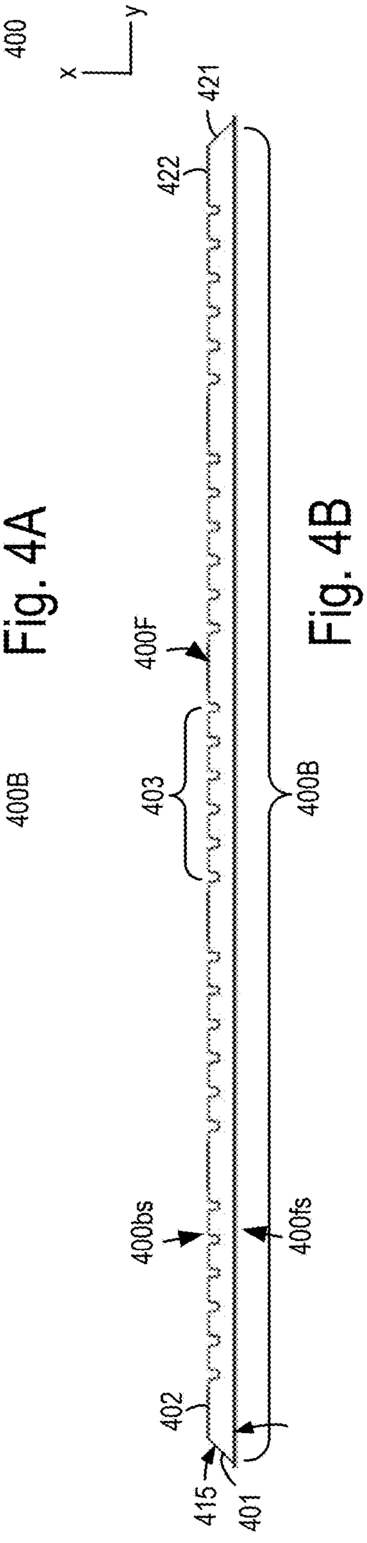
FIG. 4B depicts a view in the x-y plane of the LED panel assembly 400 of FIG. 4A, in accordance with various embodiments.

FIG. 4B depicts a view in the x-y plane of the LED panel assembly 400 of FIG. 4A, in accordance with various embodiments. This view shows the back 400*bs* and front 400*fs* of the frame 400F. The back and front may be planar and parallel to one another. The bevel of the beveled edge 401 is at an angle represented by arrows 415 relative to the surface of the LED panel. For example, the angle can be 45 degrees but other options are possible. The bevel angle can be based on the orientation of adjacent LED panels of the multi-panel display. In one approach, both sides 400L and 400R are beveled at the same angle, e.g., both at 45 degrees. This may be appropriate when then edges of the adjacent panels meet at a right angle. However, other options are possible. For instance, see FIG. 6B. It is also possible for only one side to be beveled. The frame can be shaped in various ways including all manufacturing and prototyping methods.

Figure 5:
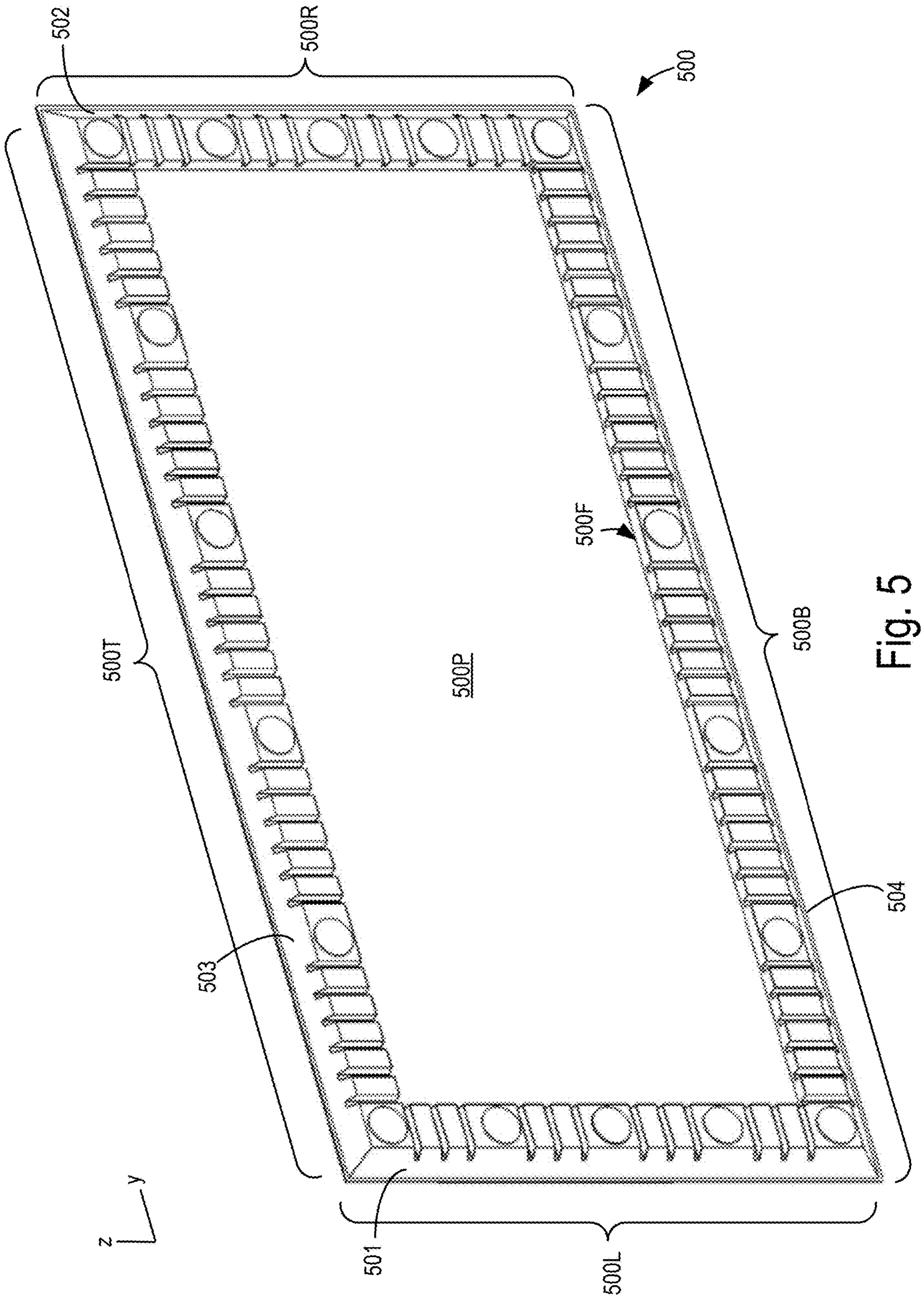
FIG. 5 depicts a view in a y-z plane of an example LED panel assembly 500 where each side 500L, 500R, 500T and 500B of a frame 500F has a beveled edge 501, 502, 503, and 504, respectively, in accordance with various embodiments.

FIG. 5 depicts a view in a y-z plane of an example LED panel assembly 500 where each side 500L, 500R, 500T and 500B of a frame 500F has a beveled edge 501, 502, 503 and 504, respectively, in accordance with various embodiments. In this example, all sides have beveled edges. The assembly includes a frame 500F attached to an LED panel 500P. The frame includes first and second opposing sides 500L and 500R, respectively, e.g., left and right sides, respectively, and third and fourth opposing sides 500T and 500B, respectively, e.g., top and bottom, respectively. The first and second sides 500L and 500R of the frame have beveled edges 501 and 502, respectively, and the third and fourth sides 500T and 500B of the frame have beveled edges 503 and 504, respectively.

The angles of the bevels can be the same or different on all four sides. In one approach, the angle of the bevels is the same for the sides 500L and 500R, and the same for the sides 500T and 500B.

The LED panel 500P may extend laterally beyond the beveled edges of the first, second, third and fourth sides.

Figure 6A:
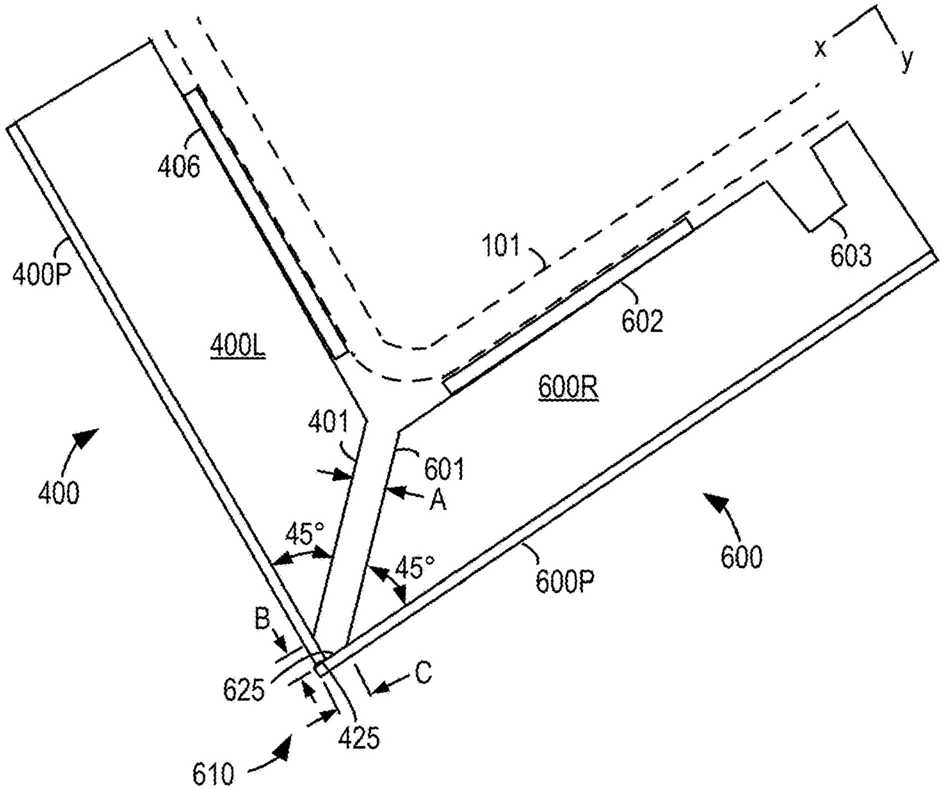
FIG. 6A depicts a top-down view of a portion of the LED panel assembly 400 and an adjacent corresponding LED panel assembly 600 attached to the mounting structure 101 of FIG. 1, in accordance with various embodiments.

FIG. 6A depicts a top-down view of a portion of the LED panel assembly 400 and an adjacent corresponding LED panel assembly 600 attached to the mounting structure 101 of FIG. 1, in accordance with various embodiments. The LED panel assembly 400 includes the LED panel 400P, the frame side 400L of the frame with the beveled edge 401, and a magnet 406. The LED panel assembly 600 includes the LED panel 600P, the frame side 600R with a beveled edge 601 and a notch 603, and a magnet 602, and may be a copy of the LED panel assembly 400. The use of beveled edges allows the panel assemblies and frame to be installed very close to one another to avoid a gap at the corner 610. In this example, there is a small gap "A" between the beveled edges. However, since the LED panels 400P and 600P extend laterally past the beveled edges 401 and 601, respectively, by distances "B" and "C," respectively (which can be the same or different), the LED panels 400P and 600P can be positioned directly next to one another with little or no gap, in an edgeless design. In this example, the end face 425 of the LED panel 400P abuts the back 625 of the LED panel 600P.

The LED panel assembly 400 and its frame are rectangular in this example but potentially other polygon shapes can be used.

In this example, the frame edges are beveled at a 45 degree angle relative to the plane of the panel.

Figure 6B:
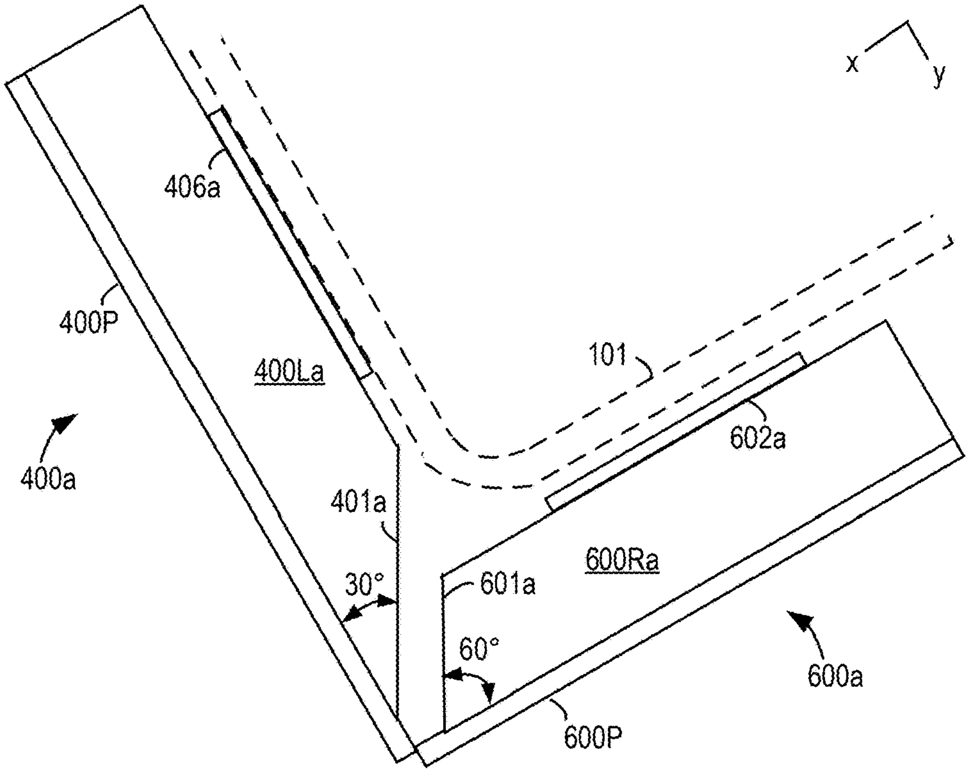
FIG. 6B depicts a top-down view of a portion of an LED panel assembly 400*a* and an adjacent corresponding LED panel assembly 600*a* attached to the mounting structure 101 of FIG. 1, where the beveled edges of the frames are at different angles, in accordance with various embodiments.

FIG. 6B depicts a top-down view of a portion of an LED panel assembly 400*a* and an adjacent corresponding LED panel assembly 600*a* attached to the mounting structure 101 of FIG. 1, where the beveled edges of the frames are at different angles, in accordance with various embodiments. In this example, the frame edges are beveled at 30 and 60 degrees relative to the plane of the panel. The LED panel assembly 400*a* includes the LED panel 400P and a frame side 400La with a beveled edge 401*a* at an angle of 30 degrees relative to plane of the panel 400P, and the LED panel 600P and a frame side 600Ra with a beveled edge 601*a* at an angle of 60 degrees relative to plane of the panel 600P. Magnets 406*a* and 602*a* are provided in the frame sides 400La and 600Ra.

When adjacent panels meet at an angle of 90 degrees, for instance, the beveled edges of the adjacent panels can have bevel angles which sum to 90 degrees or less, in one approach. This ensures that the beveled edges will not contact one another when the adjacent panels are positioned on the mounting structure. When the adjacent panels meet at an acute angle, the sum of the angles of the adjacent panels may be no more than the acute angle, in one approach. For example, consider an octagonal multi-panel display where adjacent LED panels meet at an acute angle of 80 degrees. In this case, the bevel angles can be 40 degrees.

Figure 7A:
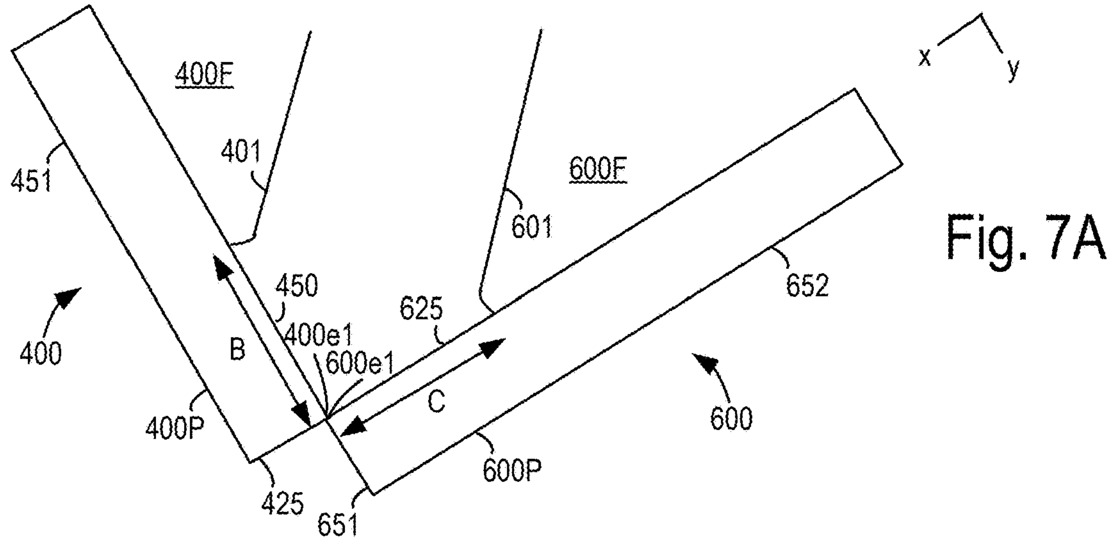
FIG. 7A depicts an example top-down view of the LED panel assembly 400 and the adjacent corresponding LED panel assembly 600 of FIG. 6A in a configuration where inside corners or edges 400*e*1 and 600*e*1 of the LED panels 400P and 600P, respectively, are aligned, in accordance with various embodiments.

FIG. 7A depicts an example top-down view of the LED panel assembly 400 and the adjacent corresponding LED panel assembly 600 of FIG. 6A in a configuration where corners or edges 400*e*1 and 600*e*1 of the LED panels 400P and 600P, respectively, are aligned, in accordance with various embodiments. Frames 400F and 600F are also depicted. The LED panel assemblies can be installed on the mounting structure in various ways, e.g., according to a design choice of the installer. In this example, the LED panels 400P and 600P touch one another at their corners or edges 400*e*1 and 600*e*1, respectively, which are vertical edges in this example. The edges could have other orientations such as horizontal or other orientation.

Figure 7B:
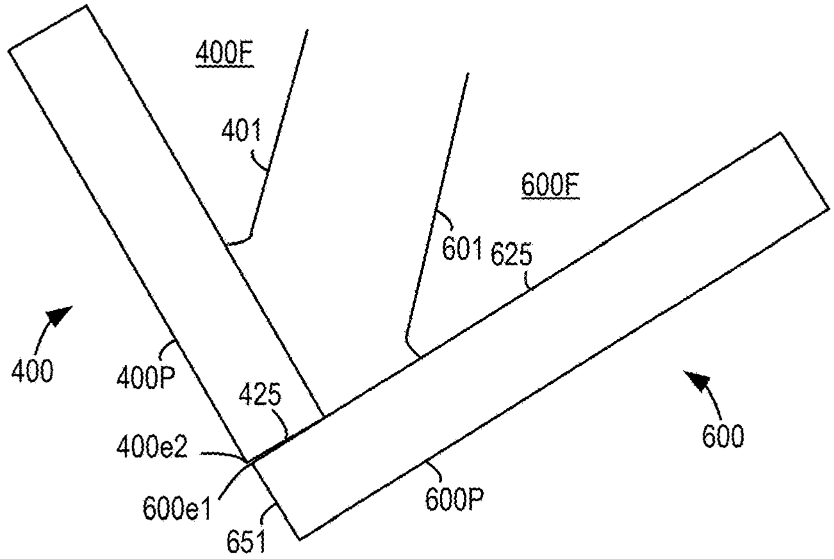
FIG. 7B depicts an example top-down view of the LED panel assembly 400 and the adjacent corresponding LED panel assembly 600 of FIG. 6A in a configuration where an outside edge 400*e*2 of the LED panel 400P is aligned with the inside edge 600*e*1 of the LED panel 600P, in accordance with various embodiments.
Figure 7C:
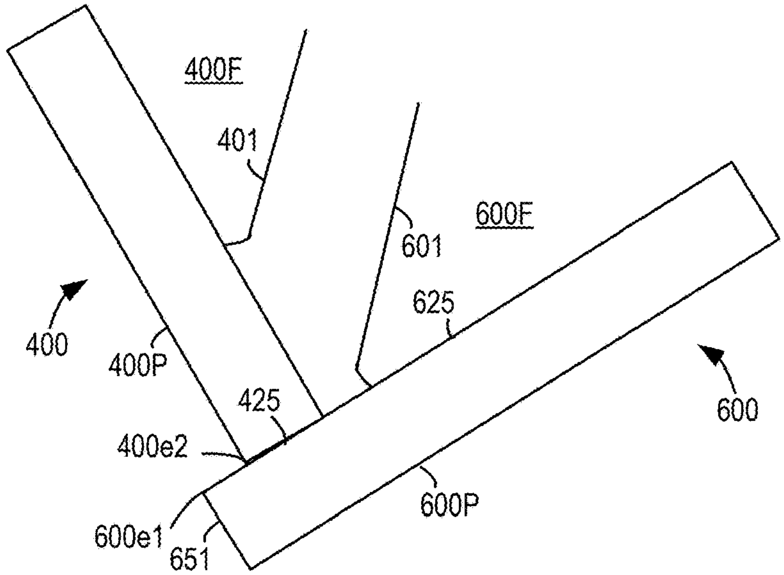
FIG. 7C depicts an example top-down view of the LED panel assembly 400 and the adjacent corresponding LED panel assembly 600 of FIG. 6A in a configuration where the outside edge 400*e*2 of the LED panel 400P is offset from the end face 651 of the LED panel 600P, respectively, in accordance with various embodiments.

Note that the examples of FIGS. 7A-7C show the LED panels meeting at a 90 degree angle, but the LED panels could alternatively meet at another angle relative to one another. Generally, the adjacent LED panels can form a convex corner, such as in FIGS. 7A-7C, or a concave corner. In FIG. 7B, the 90 degree angle can result in the end face 425 being aligned with or abutting the back side 625. However, this alignment or abutting would not occur if the LED panels are at another angle such as 120 degrees.

The examples of FIGS. 7A-7C also show the end face 425 being at a 90 degree angle relative to a front side 451 and a back side 450 of the LED panel 400P, and the end face 651 being at a 90 degree angle relative to a front side 652 and a back side 625 of the LED panel 600P. Other configurations are possible.

FIG. 7B depicts an example top-down view of the LED panel assembly 400 and the adjacent corresponding LED panel assembly 600 of FIG. 6A in a configuration where an outside edge 400*e*2 of the LED panel 400P is aligned with the inside edge 600*e*1 of the LED panel 600P, in accordance with various embodiments.

FIG. 7C depicts an example top-down view of the LED panel assembly 400 and the adjacent corresponding LED panel assembly 600 of FIG. 6A in a configuration where the outside edge 400*e*2 of the LED panel 400P is offset from the inside edge 600*e*1 of the LED panel 600P, respectively, in accordance with various embodiments.

Any of the approaches of FIGS. 7A-7B advantageously results in only a small seam between the adjacent LED panels corresponding to the thickness of an LED panel.

As discussed, the use of beveled edges allows the LED panel assemblies to be positioned very close together to minimize or avoid gaps. Another approach involves lateral protrusions at staggered locations along the edges of the frame.

Figure 8:
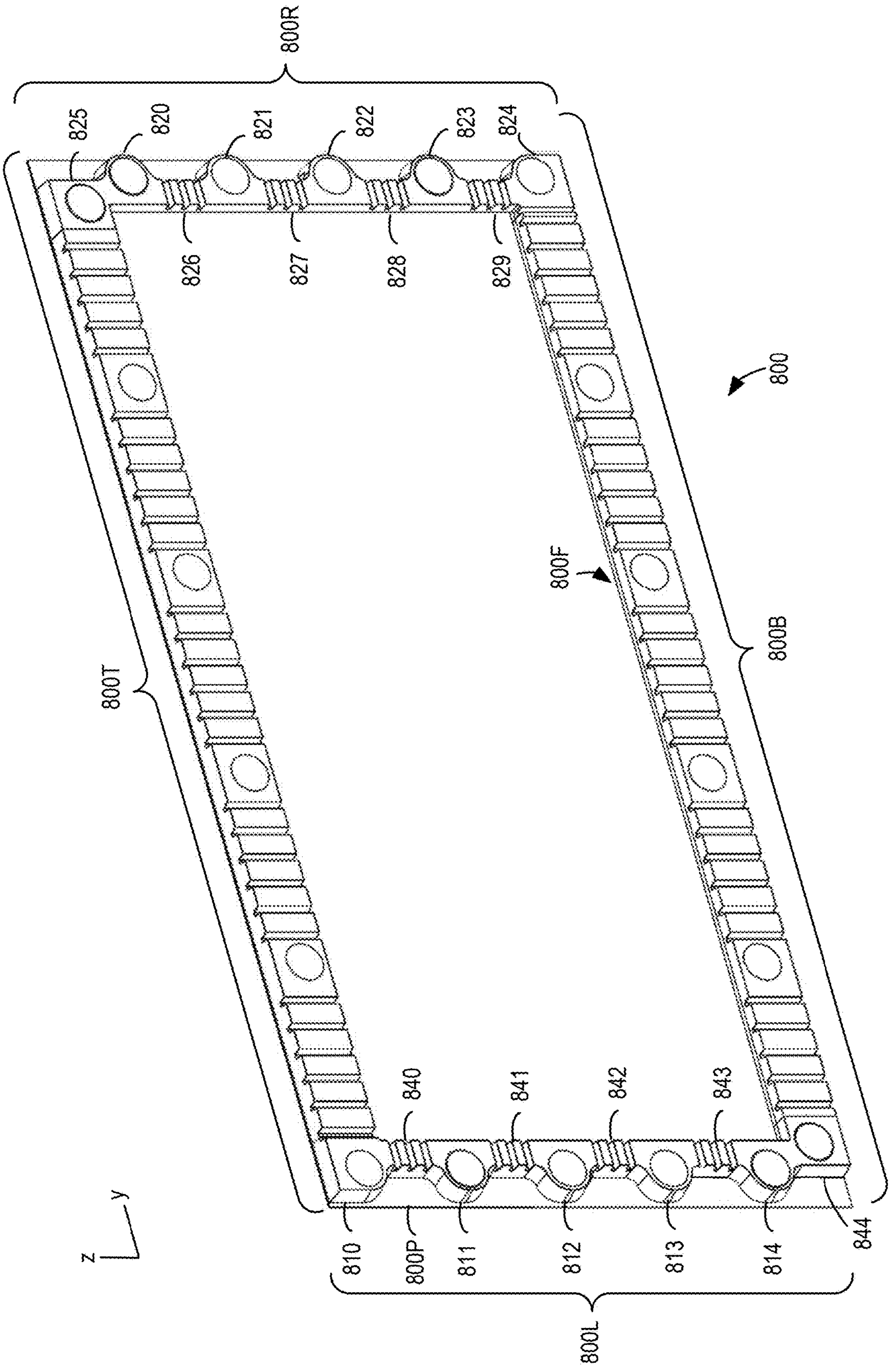
FIG. 8 depicts a view in a y-z plane of an example LED panel assembly 800 where opposing sides 800L and 800R of a frame 800F have protrusions at staggered locations, in accordance with various embodiments.

FIG. 8 depicts a view in a y-z plane of an example LED panel assembly 800 where opposing sides 800L and 800R of a frame 800F have protrusions at staggered locations, in accordance with various embodiments. The first side 800L includes protrusions 810, 811, 812, 813 and 814 that alternate with recesses 840, 841, 842, 843 and 844. The protrusions extend laterally and can have a rounded shape. The protrusions 811-814 have a symmetry with respect to the y direction which is perpendicular to a length of the side 800L. The protrusion 810 is asymmetrical in that half is rounded and half is rectangular or square off.

The protrusions are provided periodically at staggered locations along the sides of the frames. The LED panel 800P may extend laterally past the protrusions, in one approach. The second side 800R also includes protrusions 820, 821, 822, 823 and 824 that alternate with recessed regions or recesses 825, 826, 827, 828 and 829. Each protrusion may include an embedded magnet on the back of the frame. With this configuration, the protrusions of adjacent frames can be interdigitated, where the protrusions at the edge of one frame are positioned between the protrusions at the edge of the adjacent frame. See FIG. 10, for example.

In one approach, the protrusions at one side of the frame 800F are aligned with the recesses at the opposing side of the frame. For the example, the locations of the protrusions 810, 811, 812, 813 and 814 are aligned with the locations of the recesses 825, 826, 827, 828 and 829, respectively, where the location is a position along the z axis in this example, in a direction along the lengths of the sides 800L and 800R of the frame. Multiple copies of the LED panel assembly 800 can be provided where the frame of each assembly can be interdigitated with the frame of the adjacent assembly.

The frame sides with the protrusion can be retrofitted to an existing LED assembly using techniques such as discussed in connection with FIG. 4A.

Figure 9:
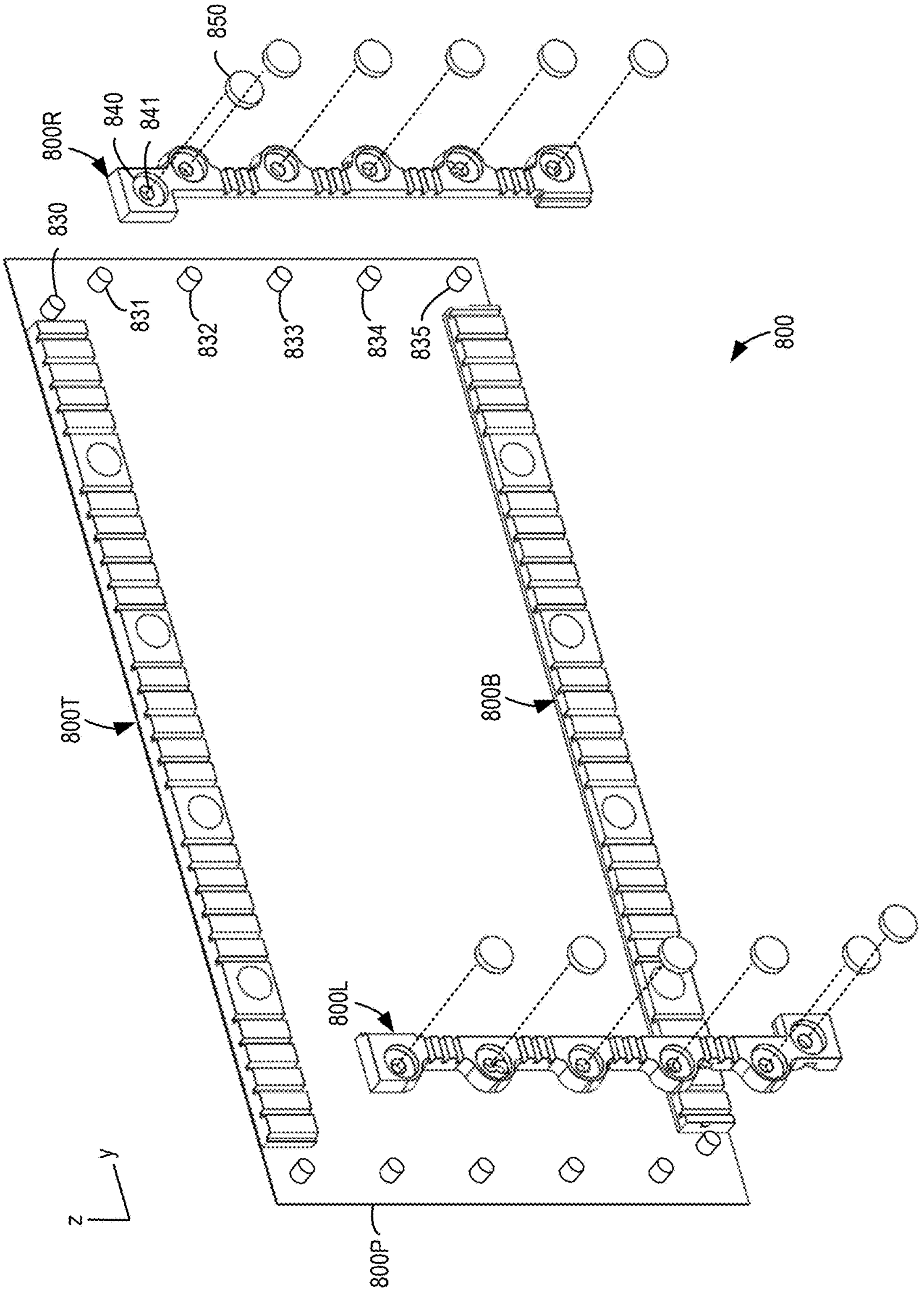
FIG. 9 depicts an exploded view of the LED panel assembly 800 of FIG. 8, in accordance with various embodiments.

FIG. 9 depicts an exploded view of the LED panel assembly 800 of FIG. 8, in accordance with various embodiments. Each side of the frame can be a separate piece which is individually attached to the back of the LED panel 800P during the manufacturing of the assembly, so that the frame is made up of discontinuous portions around the periphery of the LED panel. In another approach, the frame sides are part of a continuous frame around the periphery of the LED panel. In one approach, each side of the frame is attached to the back of the LED panel 800P by fasteners and/or adhesive. For example, posts 830, 831, 832, 833, 834 and 835 may be aligned with holes in the frame side 800R. The posts may be threaded to allow the frame to be secured against the back of the LED panel with bolts. Or, the posts may be used to guide the position of the frame side 800R as it is attached to the back of the LED panel with adhesive, for example. The posts may further be aligned with recesses in the frame in which magnets are embedded, e.g., by adhesive or a thread fasteners, for example. The magnet face should generally be smooth to allow good contact with the mounting structure. An example recess 840 in the frame side 800R with a magnet 850 are shown.

Figure 10:
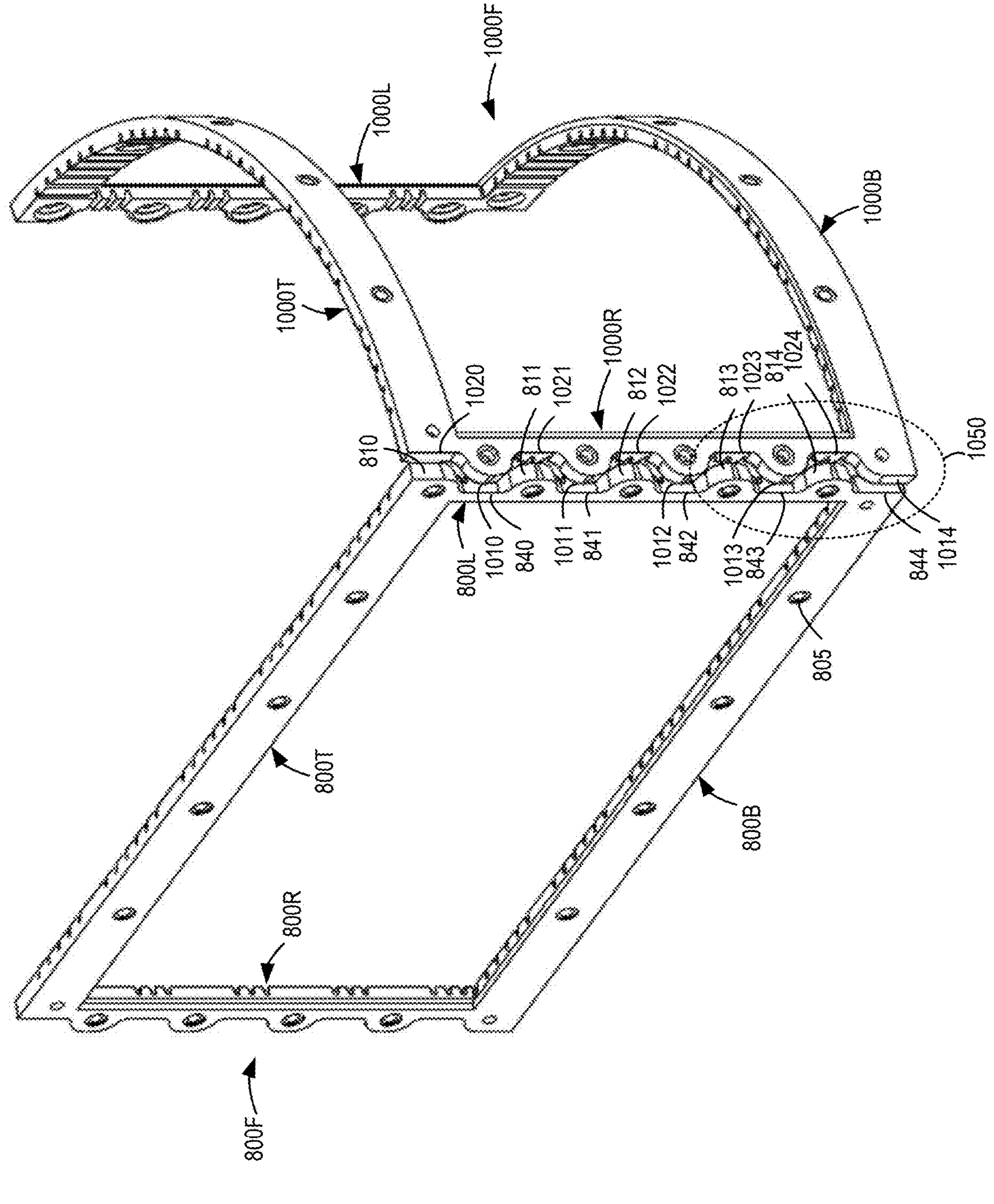
FIG. 10 depicts the frame 800F of FIG. 8 and an adjacent corresponding frame 1000F where the protrusions of the frames are interdigitated, in accordance with various embodiments.

FIG. 10 depicts the frame 800F of FIG. 8 and an adjacent corresponding frame 1000F where the protrusions of the frames are interdigitated, in accordance with various embodiments. The LED panel assembly 800 includes the LED panel 800P and the frame 800F, with left and right sides 800L and 800R, respectively, and top and bottom 800T and 800B, respectively. The frame 1000F is a copy of the frame 1000F, and includes left and right sides 1000L and 1000R, respectively, and top and bottom 1000T and 1000B, respectively.

The frame bottom 800B can include holes such as the example hole 805 for use in attaching the frame bottom 800B to the LED panel 800P with a fastener.

The frame side 1000R includes protrusions 1010, 1011, 1012, 1013 and 1014 which alternate with recesses 1020, 1021, 1022, 1023 and 1024. The frame sides 800L and 1000R are interdigitated when the protrusions 1010, 1011, 1012, 1013 and 1014 of the frame side 1000R are in contact with the recesses 840, 841, 842, 843 and 844, respectively, of the frame side 800L. Similarly, the protrusions 810, 811, 812, 813 and 814 of the frame side 800L are in contact with the recesses 1020, 1021, 1022, 1023 and 1024, respectively, of the frame side 1000R.

Figure 11B:
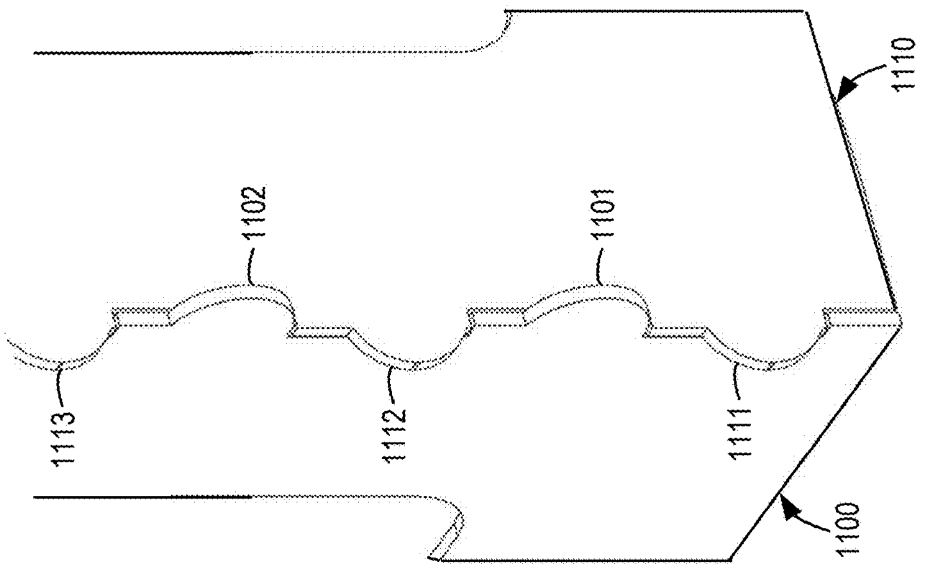
FIG. 11B depicts the portions of the mounting structures 1100 and 1110 joined together, in accordance with various embodiments.
Figure 11A:
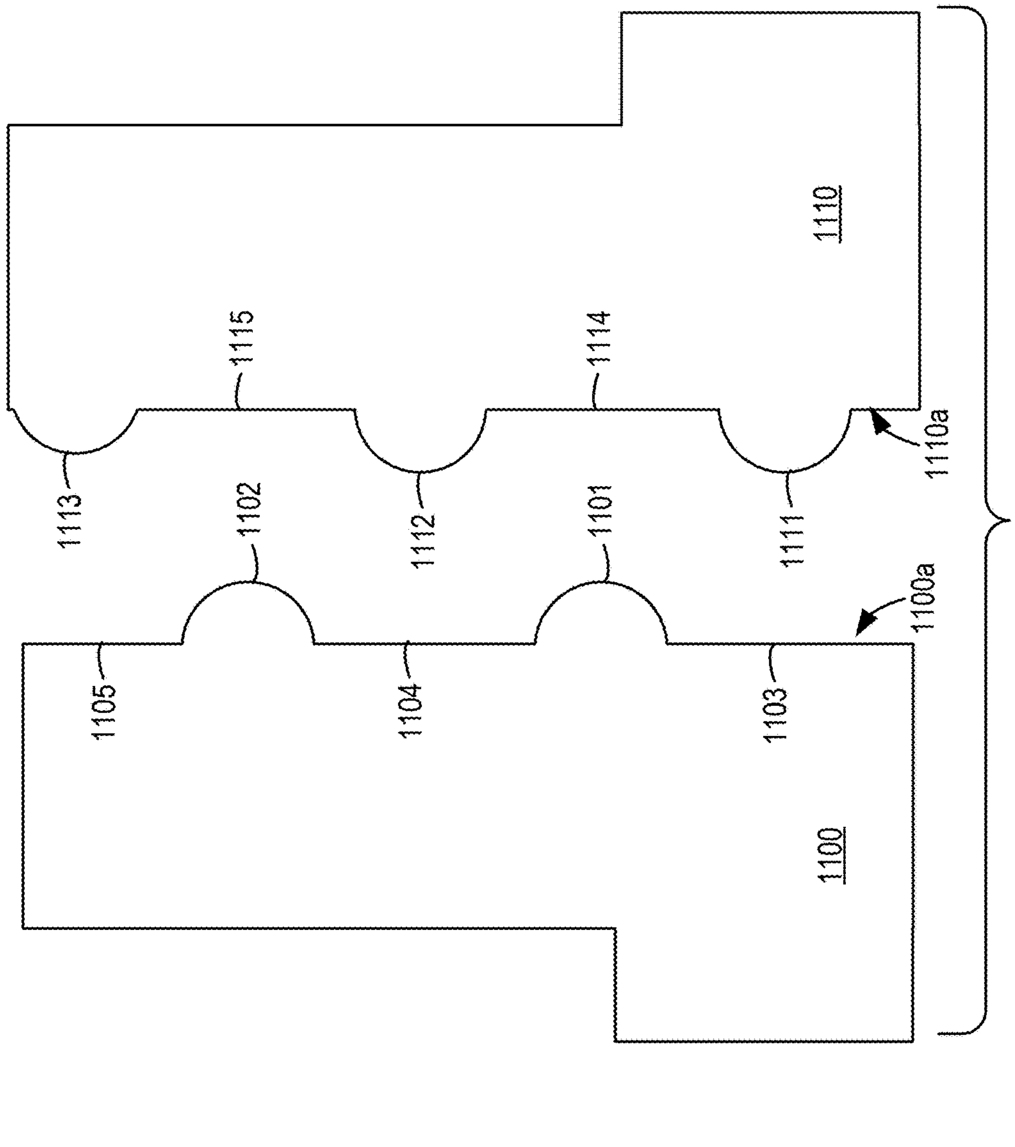
FIG. 11A depicts separate portions of mounting structures 1100 and 1110 having protrusions at staggered locations corresponding to the protrusions of the frames 800F and 1000F, respectively, in accordance with various embodiments.
Figure 12:
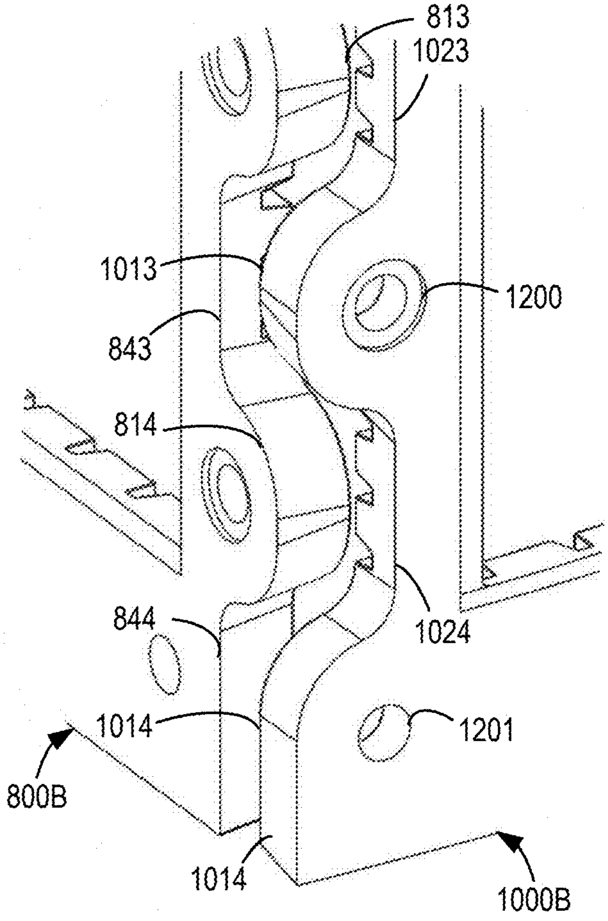
FIG. 12 depicts portions of the frames 800F and 1000F corresponding to the portions of the mounting structures 1100 and 1110, respectively, and consistent with FIG. 10, in accordance with various embodiments.

The region 1050 is discussed further in connection with FIGS. 11 and 12.

FIG. 11A depicts separate portions of mounting structures 1100 and 1110 having protrusions at staggered locations corresponding to the protrusions of the frames 800F and 1000F, respectively, in accordance with various embodiments. The mounting structure can be modified to optimize the use of the frame protrusions in the LED panel assembly. In one possible approach, the mounting structure is formed from two separate portions 1100 and 1110 which are joined together. For example, the portions may be sheet metal which are joined by welding or by the use of fasteners. The portion 1100 includes protrusions 1101 and 1102 which alternate with recesses 1103, 1104 and 1105 on a first side 1100*a* of the portion 1100. The portion 1110 includes protrusions 1111, 1112 and 1113 which alternate with recesses 1114 and 1115 on a first side 1110*a* of the portion 1110. When the two portions are joined, the protrusions 1101 and 1102 are aligned with the recesses 1114 and 1115, respectively. Similarly, the protrusions 1111, 1112 and 1113 are aligned with the recesses 1103, 1104 and 1105, respectively.

FIG. 11B depicts the portions of the mounting structures 1100 and 1110 joined together, in accordance with various embodiments. The portions can be joined at a right angle or other angle.

FIG. 12 depicts portions of the frames 800F and 1000F corresponding to the portions of the mounting structures 1100 and 1110, respectively, and consistent with FIG. 10, in accordance with various embodiments. The lateral protrusions of the frames are co-located with the protrusion of the mounting structure portions to optimize the contact of the magnets in the lateral protrusions with the mounting structure portions. For example, the lateral protrusions 813 and 814 of the frame 800F are aligned with the protrusions 1102 and 1101, respectively, of the mounting structure portion 1100. Also, the lateral protrusions 1013 and 1014 of the frame 1000F are aligned with the protrusions 1112 and 1111, respectively, of the mounting structure portion 1110.

The LED panels are not shown in this example but would be attached to the frames. In one approach, an LED panel has posts or fasteners that are inserted into holes in the protrusions such as the example holes 1200 and 1201 in the protrusions 1013 and 1014, respectively.

Figure 13:
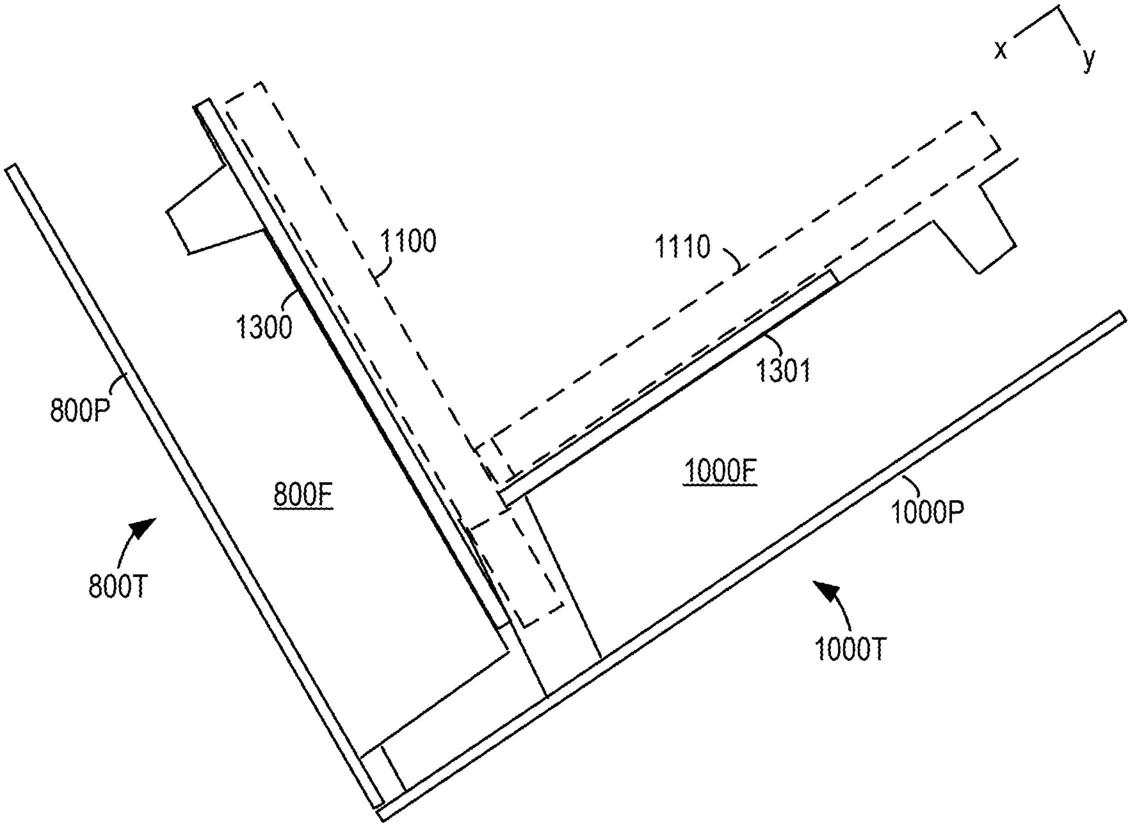
FIG. 13 depicts a top-down view of part of the tops 800T and 1000T of the frames 800F and 1000F, respectively, of FIG. 10, in accordance with various embodiments.

FIG. 13 depicts a top-down view of part of the tops 800T and 1000T of the frames 800F and 1000F, respectively, of FIG. 10, in accordance with various embodiments. The frame 800F is depicted with a magnet 1300 that contacts a protrusion of the portion 1100 of the mounting structure, and the frame 1000F of an LED panel 1000P is depicted with a magnet 1301 which contacts a protrusion of the portion 1110 of the mounting structure.

Figure 14:
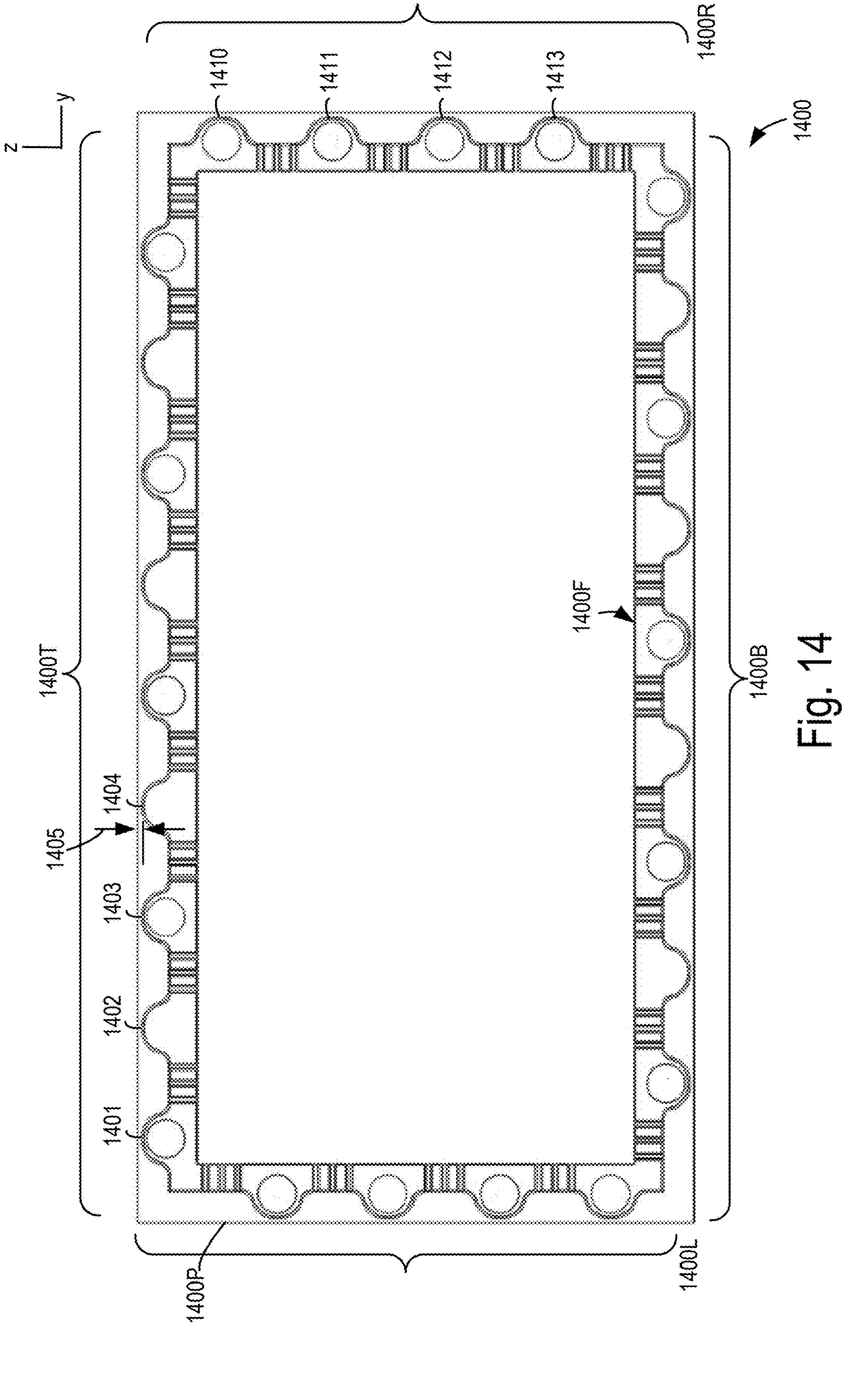
FIG. 14 depicts a view in a y-z plane of an example LED panel assembly 1400 where left and right opposing sides 1400L and 1400R, respectively, and top and bottom opposing sides 1400T and 1400B, respectively, of a frame 1400F have protrusions at staggered locations, in accordance with various embodiments.

FIG. 14 depicts a view in a y-z plane of an example LED panel assembly 1400 where left and right opposing sides 1400L and 1400R, respectively, and top and bottom opposing sides 1400T and 1400B, respectively, of a frame 1400F have protrusions at staggered locations, in accordance with various embodiments. The protrusions are thus provided on all four sides of the frame.

This approach allows all sides of the frame to benefit from the use of protrusions that are interdigitated with the adjacent frame, whether the adjacent frame is above, below or to the side of the frame 1400F. The right-hand frame side 1400R includes protrusions 1410, 1411, 1412 and 1413 while the top frame 1400R includes example protrusions 1401, 1402, 1403 and 1404. The LED panel 1400P can extend laterally beyond the protrusions, e.g., by an amount depicted by arrow 1405, to allow for a precise panel-to-panel fit. In this example, the magnets, represented by circles (but the magnets could be any shape), are provided in every other protrusion in the top and bottom frame sides, as this may provide a sufficient attachment strength of the frame to the mounting structure.

Figure 15A:
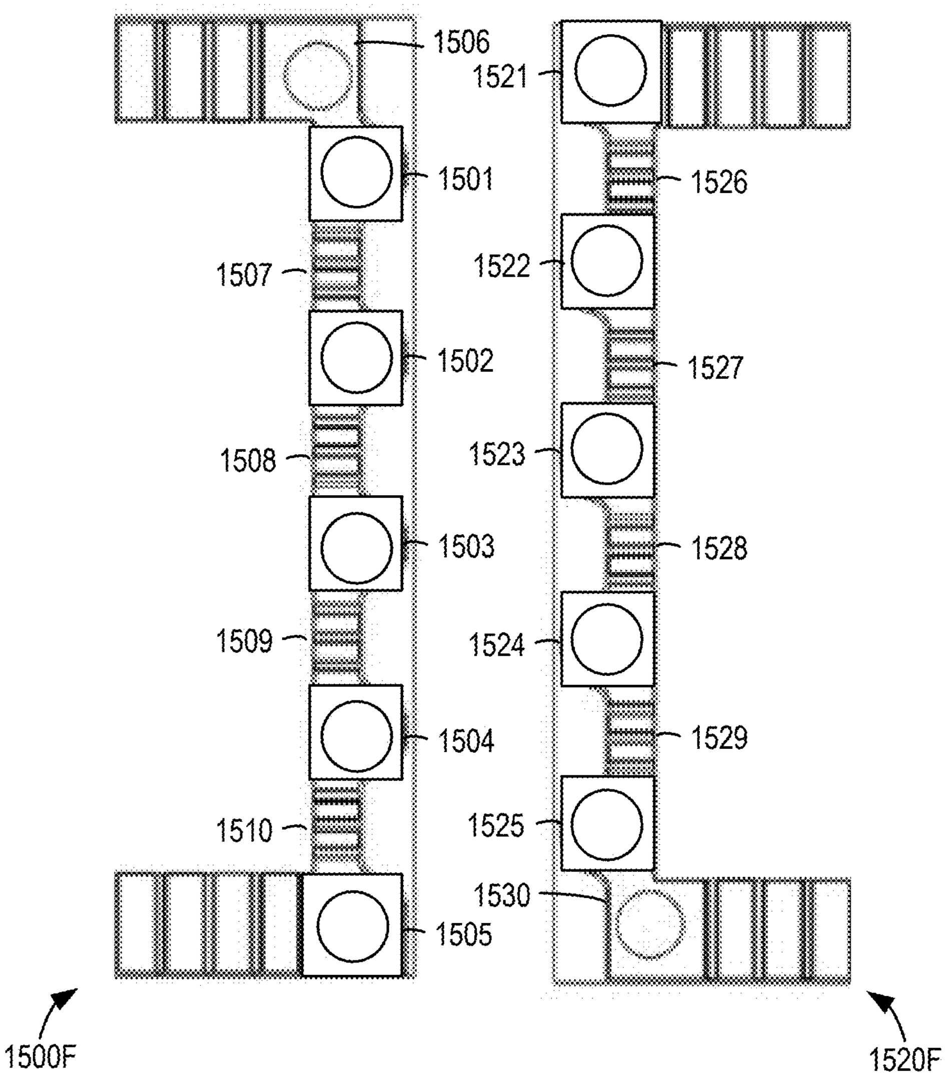
FIG. 15A depicts a view of edges of example frames 1500F and 1520F with rectangular protrusions at staggered locations, in accordance with various embodiments.

FIG. 15A depicts a view of edges of example frames 1500F and 1520F with rectangular protrusions at staggered locations, in accordance with various embodiments. As mentioned, the lateral protrusions of the frame can have various shapes including rounded and/or rectangular. Here, the frame 1500F includes rectangular protrusions 1501, 1502, 1503, 1504 and 1505 alternating with recesses 1506, 1507, 1508, 1509 and 1510. The frame 1520F includes rectangular protrusions 1521, 1522, 1523, 1524 and 1525 alternating with recesses 1526, 1527, 1528, 1529 and 1530. The shape of the protrusions can help facilitate the alignment of adjacent panels. The interdigitated rectangular protrusions of the adjacent frames can potentially contact each other and lock in place in an interlocked manner.

Figure 15B:
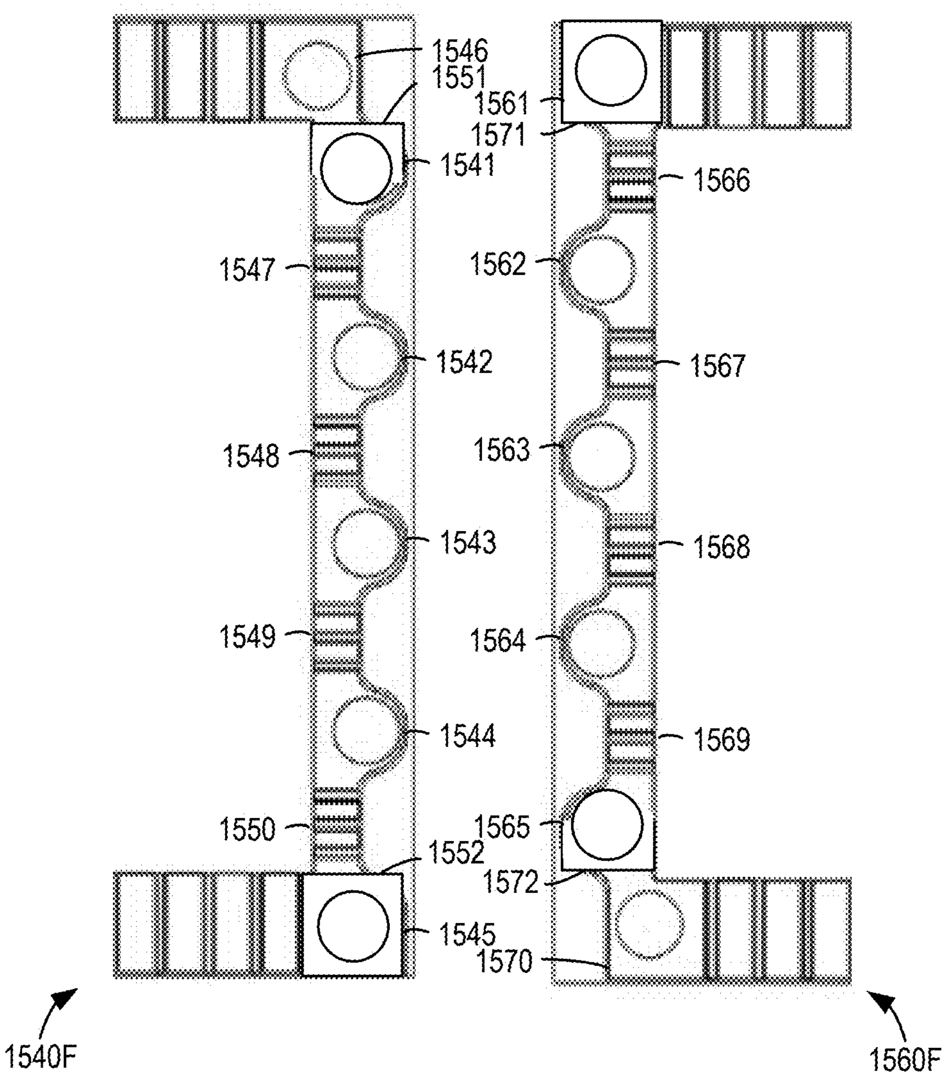
FIG. 15B depicts a view of edges of example frames 1540F and 1560F with rectangular and rounded protrusions at staggered locations, in accordance with various embodiments.

FIG. 15B depicts a view of edges of example frames 1540F and 1560F with rectangular and rounded protrusions at staggered locations, in accordance with various embodiments. In this case, the first and/or last protrusions of the frames can be rectangular or at least have a right angle on one side of the protrusion while the intermediate protrusions are rounded. In particular, the frame 1540F includes a first protrusion 1541 having a face or surface 1551 that makes a right angle with the recess 1546. The intermediate protrusions 1542, 1543 and 1544 are rounded. The last protrusion 1545 is rectangular to provide a close fit with the recess 1570 with the surfaces 1552 and 1572 contacting one another. Recesses 1547, 1548, 1549 and 1550 are also depicted.

The frame 1560F includes a first rectangular protrusion 1561 to provide a close fit with the recess 1546, with the surfaces 1551 and 1571 contacting one another. The frame also includes intermediate protrusions 1562, 1563 and 1564, which are rounded, and a last protrusion 1565 having a surface 1572 that makes a right angle with the recess 1570. The frame 1560F further includes recesses 1566, 1567, 1568, 1569 and 1570.

Figure 16:
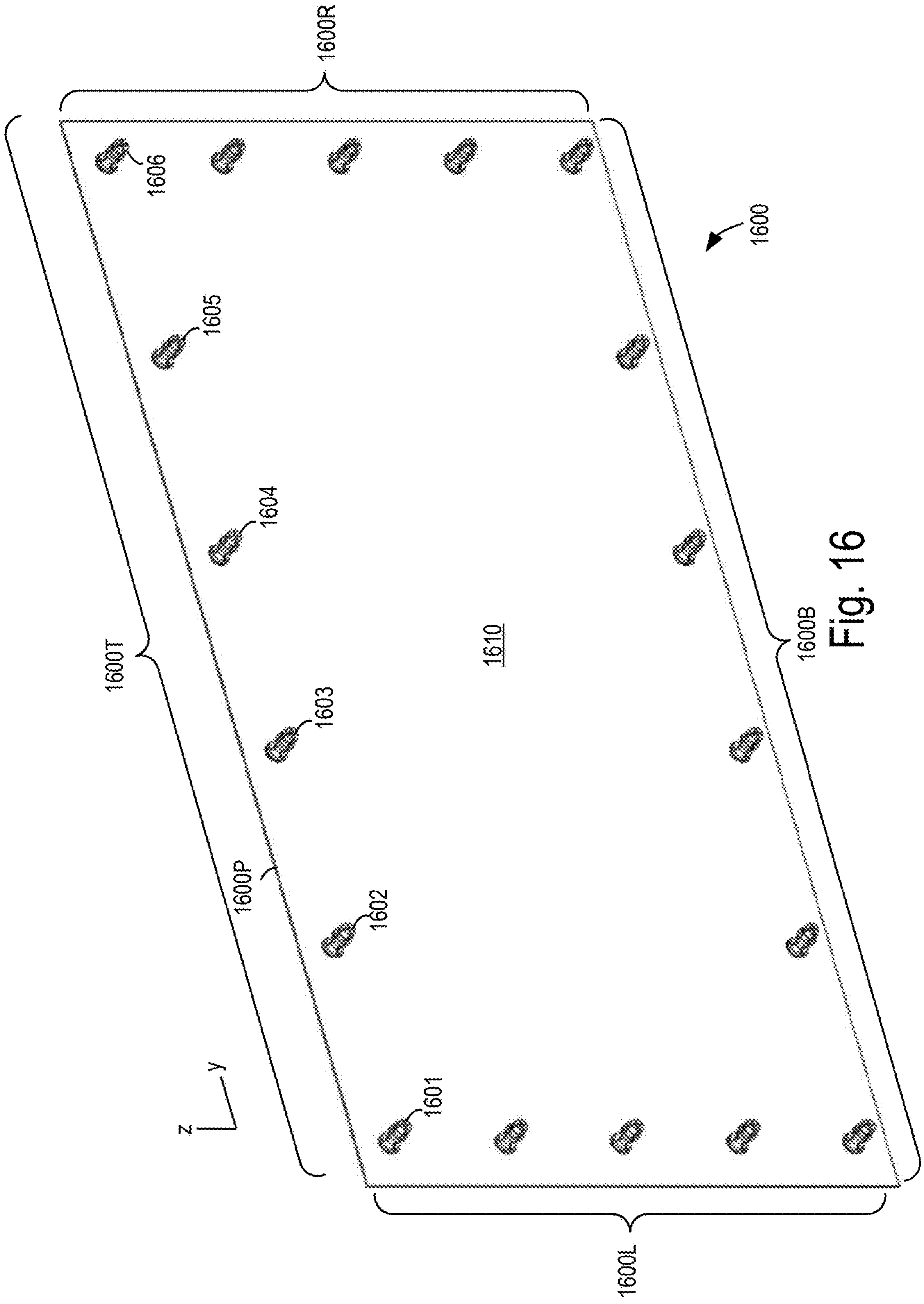
FIG. 16 depicts a view in a y-z plane of an example LED panel assembly 1600 where standoff fasteners are arranged on a bare LED panel 1600P, in accordance with various embodiments.

FIG. 16 depicts a view in a y-z plane of an example LED panel assembly 1600 where standoff fasteners are arranged on a bare LED panel 1600P, in accordance with various embodiments. The LED panel can be a bare panel, e.g., a panel alone without a frame, with standoff fasteners which snap-fit into holes of the mounting structure. This avoids the need for a frame, which adds weight and cost. The LED panel assembly 1600 includes an LED panel 1600 with left and right opposing sides 1600L and 1600R, respectively, and top and bottom opposing sides 1600T and 1600B, respectively. A number of standoff fasteners are arranged along the back 1610 of the LED panel, including example standoff fasteners 1601, 1602, 1603, 1604, 1605 and 1606 along the top side 1600T. The fasteners are arranged along a periphery of the panel 1600P.

In one approach, the distance between the fasteners and the edge of the panel is equal for all sides of the panel. In another approach, there is a first distance between the fasteners and the edge of the panel for the left and right sides of the panel, and a second distance between the fasteners and the edge of the panel for the top and bottoms of the panel, where the second distance can differ from the first distance. Other approaches are possible as well.

This approach can eliminate the use of screws and magnets, although a suction tool may be needed to remove the LED assembly after it is snapped into place on the mounting structure.

Figure 17A:
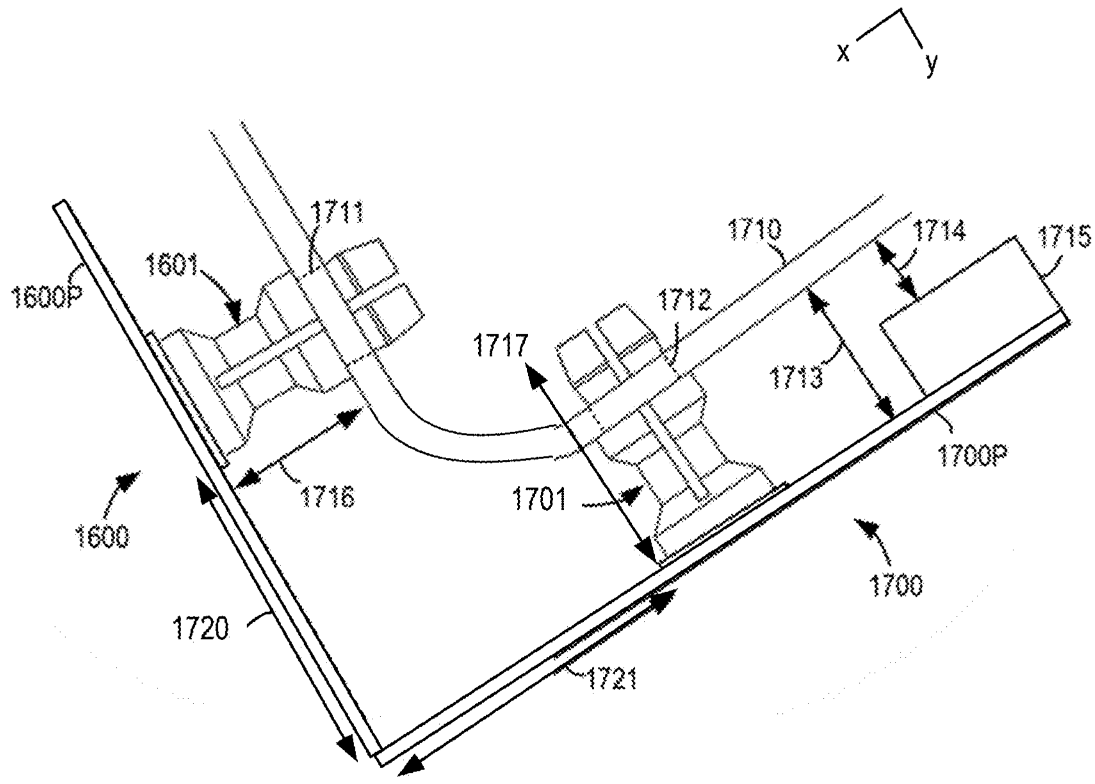
FIG. 17A depicts an example top-down view of the LED panel assembly 1600 of FIG. 16 and an adjacent corresponding LED panel assembly 1700, in accordance with various embodiments.

FIG. 17A depicts an example top-down view of the LED panel assembly 1600 of FIG. 16 and an adjacent corresponding LED panel assembly 1700, in accordance with various embodiments. The LED panel assembly 1700 can be a copy of the assembly 1600 in one approach. The LED panel assembly 1600 includes the panel 1600P with the fastener 1601 snap-fit into a hole 1711 in a mounting structure 1710. Example details of the fastener are provided in FIG. 17B. An arrow 1716 represents a distance between the panel 1600P and the mounting structurer 1710, and an arrow 1720 represents a distance between the fastener 1601, e.g., at its base, and an edge of the panel 1600P at the left side 1600L.

The corresponding LED panel assembly 1700 includes an LED panel 1700P and a fastener 1701 which is snap-fit into a hole 1712 of the mounting structure 1710. An arrow 1717 represents a height of the fastener 1701, and an arrow 1721 represents a distance between the fastener, e.g., at its base, to the edge of the panel.

In one approach, each standoff fastener is spaced apart from an edge of the bare LED panel by at least a height of the fastener. This provides sufficient space for positioning the edges of the LED panels so that they can touch each other to avoid a gap.

Figure 17B:
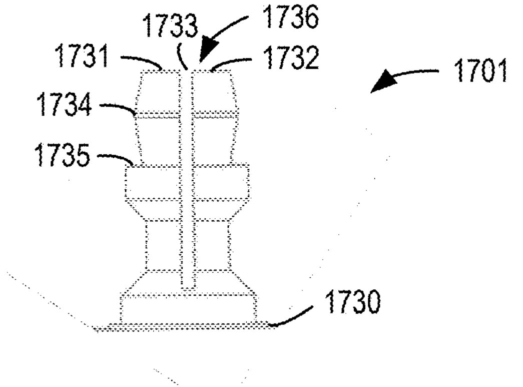
FIG. 17B depicts an example view of the fastener 1701 of FIG. 17A, in accordance with various embodiments.

FIG. 17B depicts an example view of the fastener 1701 of FIG. 17A, in accordance with various embodiments. Many different types of fasteners can be used. In this example, the fastener is a snap-fit fastener, for example, which fits into a corresponding hole in the mounting structure. The fastener extends from a base 1730 to a tip 1736 and includes opposing sides 1731 and 1732 separated by a slit 1733 along its length. When the fastener is first inserted into the hole, the sides deform inward due to a force exerted on the widened region 1734. The fastener is inserted further until the shoulder 1735 rests against the mounting structure. The base of the faster can be attached to the panel in different ways such as by adhesive, another fastener or a shaped recess in the panel.

In another example, the fastener has a threaded core and the magnet is attached by a threaded bolt that extends through the magnet and into the threaded core. In another example, the fastener includes a threaded bolt and the magnet has a thread core. Other approaches are possible as well. The snap on fasteners could be plastic/metal or other material, and can be round or any other shape.

Figures 18A, 18B:
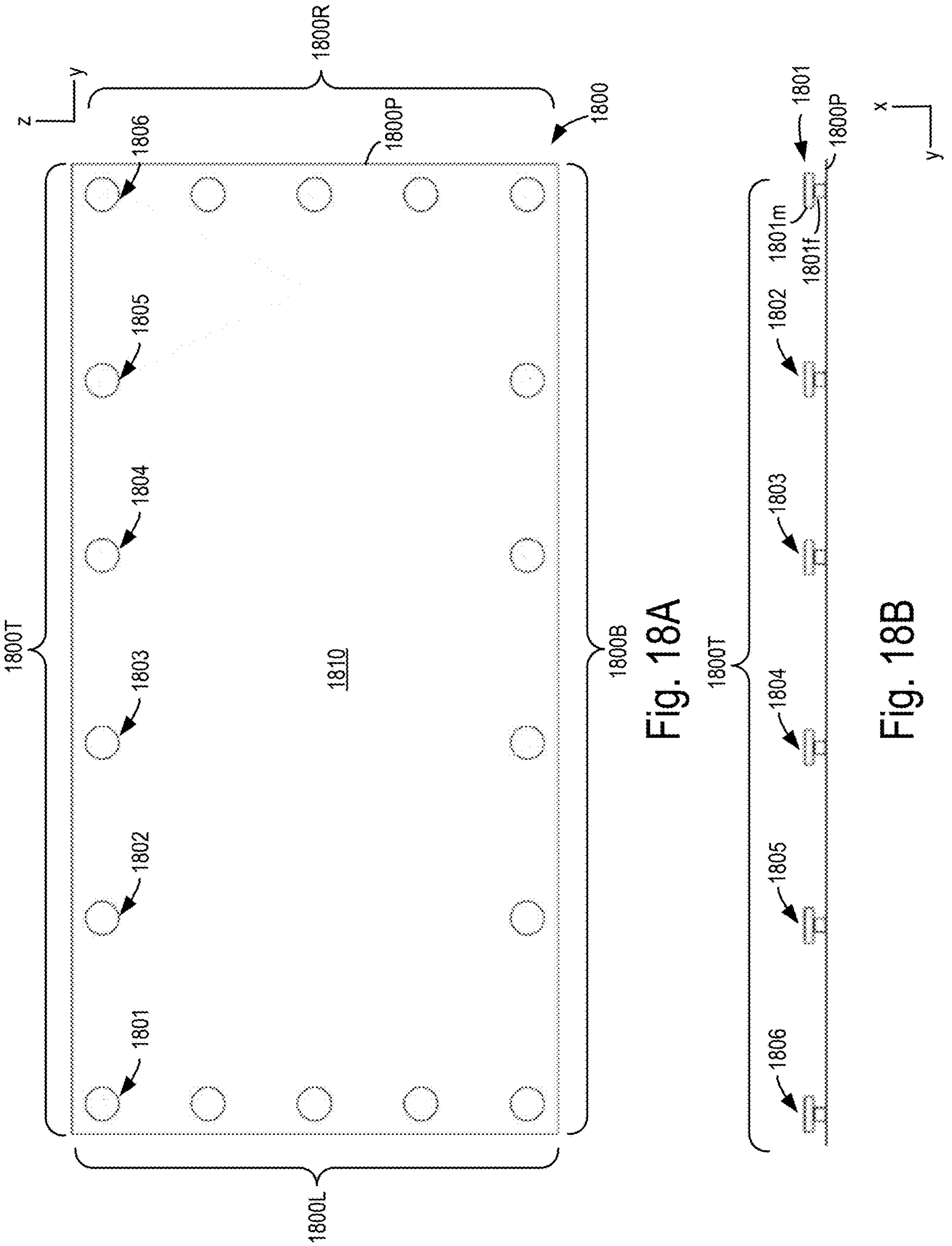
FIG. 18A depicts a view in a y-z plane of an example LED panel assembly 1800 having magnets arranged on fasteners attached a bare LED panel 1800P, in accordance with various embodiments.
FIG. 18B depicts a view in the x-y plane of the LED panel assembly 1800 of FIG. 18A along the top 1800T, in accordance with various embodiments.

FIG. 18A depicts a view in a y-z plane of an example LED panel assembly 1800 having magnets arranged on fasteners attached a bare LED panel 1800P, in accordance with various embodiments. The LED panel assembly 1800 includes an LED panel 1800 with left and right opposing sides 1800L and 1800R, respectively, and top and bottom opposing sides 1800T and 1800B, respectively. A number of standoff fasteners are arranged along a periphery of the back 1810 of the LED panel, including example standoff fastener/magnet assemblies 1801, 1802, 1803, 1804, 1805 and 1806 along the top 1800T. Each magnet assembly can include a magnet attached to a fastener such as by using a screw, a snap-fit mechanism or other approach. The magnet can be wider than the fastener.

In one approach, the distance between the magnets and the edge of the panel is equal for all sides of the panel. In another approach, there is a first distance between the magnets and the edge of the panel for the left and right sides of the panel, and a second distance between the magnets and the edge of the panel for the top and bottom of the panel, where the second distance can differ from the first distance. Other approaches are possible as well.

FIG. 18B depicts a view in the x-y plane of the LED panel assembly 1800 of FIG. 18A along the top 1800T, in accordance with various embodiments. The magnet assemblies 1801-1806 are depicted. The magnet assembly 1801 includes a fastener 1801*f* and a magnet 1801*m* in this example. In other possible implementations, the magnets can be surface mounted/glued/soldered on to the PCB board without fasteners. See also FIG. 20.

Figure 19:
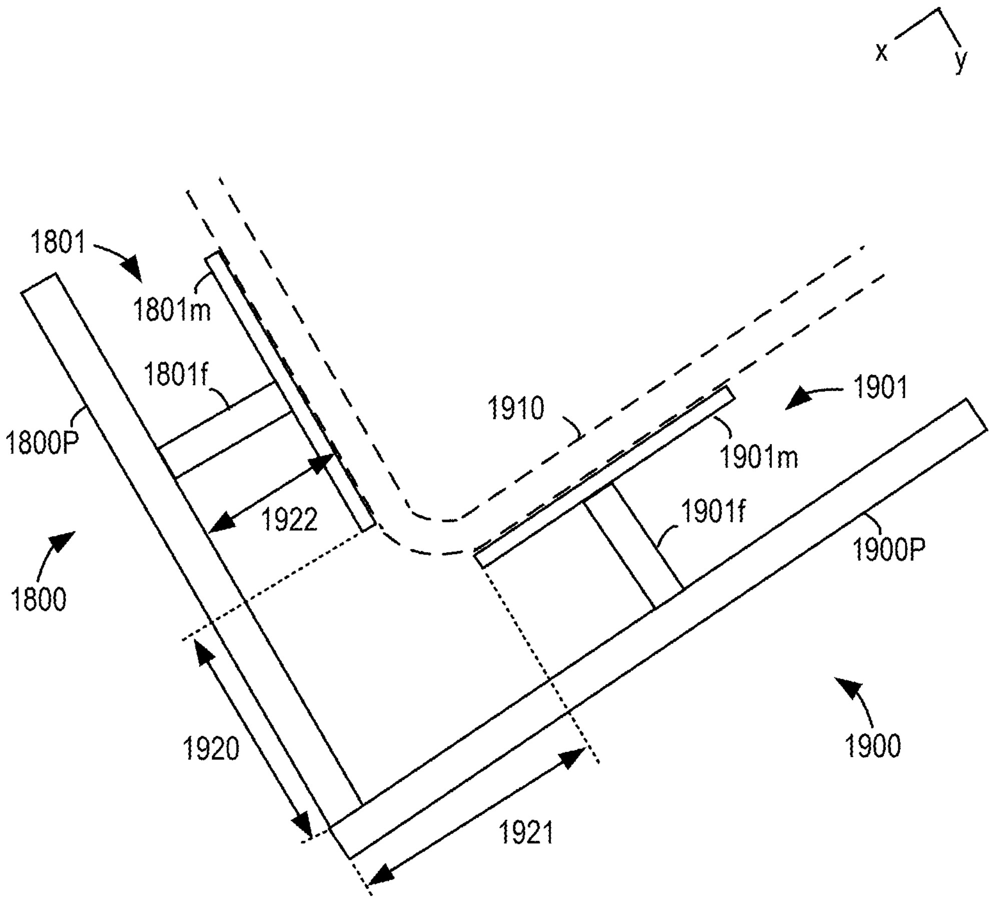
FIG. 19 depicts an example top-down view of the LED panel assembly 1800 of FIG. 18 and an adjacent corresponding LED panel assembly 1900, in accordance with various embodiments.

FIG. 19 depicts an example top-down view of the LED panel assembly 1800 of FIG. 18 and an adjacent corresponding LED panel assembly 1900, in accordance with various embodiments. The LED panel assembly 1900 can be a copy of the assembly 1800 in one approach. The LED panel assembly 1800 includes the panel 1800P with the magnet assembly 1801, including the fastener 1801*f* and the magnet 1801*m* attached by magnetism to a mounting structure 1910. The LED panel assembly 1900 includes the panel 1900P with a magnet assembly 1901, including a fastener 1901*f* and a magnet 1901*m* attached by magnetism to the mounting structure 1910.

An arrow 1922 represents a distance between the panel 1800P and the mounting structurer 1910. An arrow 1920 represents a distance between the magnet 1801*m*, e.g., at its edge, and an edge of the panel 1800P at the left side 1800L. An arrow 1921 represents a distance between the magnet 1901*m*, e.g., at its edge, and an edge of the panel 1900P.

In one approach, each magnet is spaced apart from an edge of the bare LED panel by at least a height of the fastener, or at least a height of the magnet and fastener combined (arrow 1922). This provides sufficient space for positioning the edges of the LED panels so that they can touch each other to avoid a gap.

Figure 20:
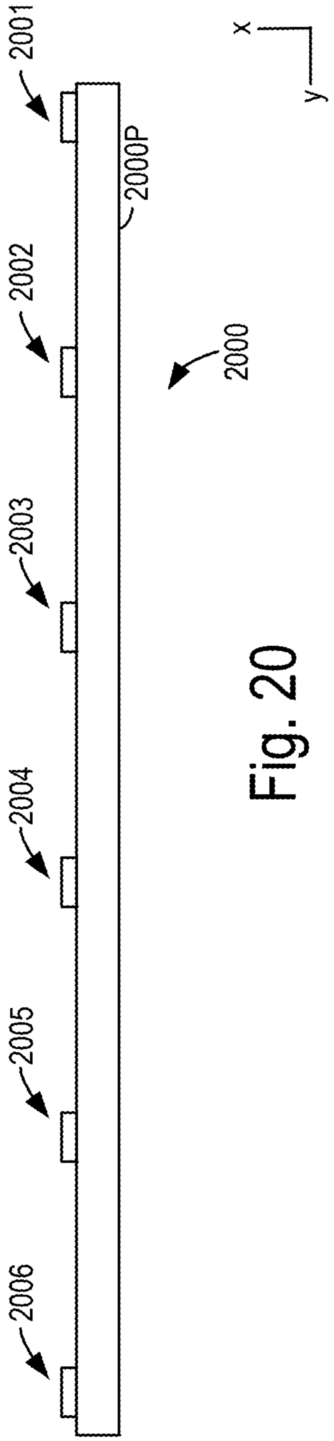
FIG. 20 depicts a view in the x-y plane of an LED panel assembly 2000 with surface-mounted magnets 2001-2006.

FIG. 20 depicts a view in the x-y plane of an LED panel assembly 2000 with surface-mounted magnets 2001-2006. As mentioned, the magnets can be surface mounted such as by gluing or soldering to the PCB board of the panel without fasteners.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. An apparatus, comprising:
- a frame having a back and an opposing front, and first and second opposing sides;
- a flexible light-emitting diode (LED) panel attached to the front of the frame; and
- one or more magnets attached to the back of the frame, wherein the first and second opposing sides of the frame comprise first and second beveled edges, respectively, the first beveled edge extends from the front to the back, and the second beveled edge extends from the front to the back.

2. The apparatus of claim 1, wherein third and fourth opposing sides of the frame comprise beveled edges.

3. The apparatus of claim 1, wherein the one or more magnets are adjacent to the beveled edges.

4. The apparatus of claim 1, wherein the frame comprises a flexible material.

5. The apparatus of claim 1, further comprising a mounting structure to which the frame is attached, wherein the mounting structure comprises a ferromagnetic metal.

6. The apparatus of claim 1, wherein the flexible LED panel extends laterally beyond the beveled edges of the first and second sides.

7. The apparatus of claim 1, wherein the first and second sides comprise notches at periodic locations along lengths of the first and second side, respectively, to increase a bending ability of the frame.

8. The apparatus of claim 1, wherein the front of the frame is wider than the back of the frame.

9. An apparatus, comprising:
- a frame having a back and an opposing front;
- a flexible light-emitting diode (LED) panel attached to the front of the frame; and
- one or more magnets attached to the back of the frame, wherein first and second opposing sides of the frame comprise beveled edges, wherein the flexible LED panel extends laterally beyond the beveled edges of the first and second sides.

10. An apparatus, comprising:
- a frame having a back and an opposing front;
- a flexible light-emitting diode (LED) panel attached to the front of the frame; and
- one or more magnets attached to the back of the frame, wherein first and second opposing sides of the frame comprise beveled edges, wherein the first and second sides comprise notches at periodic locations along lengths of the first and second side, respectively, to increase a bending ability of the frame.

* * * * *